US009606439B2

(12) United States Patent
Brust et al.

(10) Patent No.: US 9,606,439 B2
(45) Date of Patent: *Mar. 28, 2017

(54) FORMING CONDUCTIVE METAL PATTERNS USING WATER-SOLUBLE POLYMERS

(71) Applicant: Eastman Kodak Company, Rochester, NY (US)

(72) Inventors: Thomas B. Brust, Webster, NY (US); Grace Ann Bennett, Scottsville, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 73 days.

This patent is subject to a terminal disclaimer.

(21) Appl. No.: 14/331,519

(22) Filed: Jul. 15, 2014

(65) Prior Publication Data

US 2016/0018737 A1 Jan. 21, 2016

(51) Int. Cl.
G03F 7/038 (2006.01)
G03F 7/40 (2006.01)
G03F 7/031 (2006.01)

(52) U.S. Cl.
CPC ............ *G03F 7/40* (2013.01); *G03F 7/031* (2013.01); *G03F 7/038* (2013.01); *G03F 7/0388* (2013.01)

(58) Field of Classification Search
CPC ........... G03F 7/40; G03F 7/0388; G03F 7/038
USPC .................... 430/16, 18, 287.1, 324
See application file for complete search history.

(56) References Cited

U.S. PATENT DOCUMENTS

| 3,677,763 | A | | 7/1972 | DeBoer |
| 3,782,938 | A | | 1/1974 | DeBoer |
| 3,969,323 | A | * | 7/1976 | Furrer .................. C08F 8/14 430/175 |
| 6,068,963 | A | * | 5/2000 | Aoshima ............... G03F 7/038 430/270.1 |
| 6,201,087 | B1 | | 3/2001 | Herr et al. |
| 6,340,506 | B1 | | 1/2002 | Buchecker et al. |
| 8,536,300 | B2 | | 9/2013 | Choi |
| 2011/0215334 | A1 | | 9/2011 | Quinn et al. |

FOREIGN PATENT DOCUMENTS

GB 1087416 A * 10/1967

OTHER PUBLICATIONS

Chen et al., "Copolymers derived from 7-acryloyloxy-4-methylcoumarin and acrylates: 1. Copolymerizability and photocrosslinking behaviours," pp. 4473-4480, Polymer vol. 37 No. 20 1996.
Chen et al., "Copolymers derived from 7-acryloyloxy-4-methylcoumarin and acrylates: 2. Reversible photocrosslinking and photocleavage," pp. 4481-4486, Polymer vol. 37 No. 20 1996.
Chen et al., "Preparation and Photoreaction of Copolymers Derived from N-(1-phenylethyl) acrylamide and 7-Acryloyloxy-4-methyl Coumarin," pp. 1867-1875, Journal of Polymer Science Part A: Polymer Chemistry, vol. 32 1994.
Chujo et al., "Polyoxazoline Having a Coumarin Moiety as a Pendant Group, Synthesis and Photogelation," pp. 2693-2697, Macromolecules 1990, 23.
Hammond et al., "Mechanisms of Photochemical Reactions in Solution. SSV. The Photodimerization of Coumarin," pp. 3103-3106, Journal of the American Chemical Society, 1969, 86.
Morrison, et al., "Solvent Effects on the Photodimerization of Coumarin," pp. 5415-5419, Journal of the American Chemical Society, 18:23, Dec. 5, 1966.
Lin et al., "Photoreversible Resists for UV Nanoimprint Lithography (UV-NIL)," pp. 2076-2082, Applied Materials & Interfaces, vol. 2 No. 7, 2010.
Lewis et al., "Lewis Acid Catalysis of Photochemical Reactions. 8. Photodimerization and Cross-Cycloaddition of Coumarin," pp. 8653-8661, 1989 American Chemical Society.
Krauch et al., "Photo-$C_4$-Cyclodimerisation von Cumarin," pp. 625-633, Ausden Max-Planck-Institut fur Kohlenforschung Strahienchemie, Mulheim-Ruhr, Jul. 30, 1965.
Jiang et al., "Polymer Mikcelles Stabilization on Demand through Reversible Photo-Cross-Linking," pp. 790-792, 2007 American Chemical Society Jan. 17, 2007.
Schenck, et al., "Photosensibilisierte Cyclodimerisation von Cumarin," pp. 1409-1412, Chemache Berichte Jahrg 1995.
Ramasubbu et al., "Topochemical photodimerization of 7-acetoxycoumarin: the acetoxy group as a steering agent," pp. 2159-2161, 1982 National Research Council of Canada, Can. J. Chem. vol. 60, 1982.
Ramasubbu et al., "Photodimerization of Coumarins in the Solid State," pp. 178-179, J. Chem Soc., Chem Commun., 1982.
Oh et al., "Synthesis, Characterization, and Emulsion Polymerization of Polymerizable Coumarin Derivatives," pp. 3479-3489, Journal of Polymer Science Part A: Polymer Chemistry, vol. 42, 2004.
Ngai et al., Effect of Cross-Linking on Dynamics of Semidilute Copolymer Solutions: Poly(methyl methacrylate-co-7-acryloyloxy-4-methylcoumarin) in Chloroform, 2003 American Chemical Society, Macromolecules 2003, 36.
Muthuramu et al., "Photodimerization of Coumarin in Aqueous and Micellar Media," pp. 3976-3979, J. Org. Chem. 1982, 47.

* cited by examiner

*Primary Examiner* — John A McPherson
(74) *Attorney, Agent, or Firm* — J. Lanny Tucker

(57) ABSTRACT

A conductive pattern can be formed using a polymeric layer that contains a reactive composition that comprises a reactive polymer that is metal ion-complexing, water-soluble, and crosslinkable. This reactive polymer comprises photosensitive non-aromatic heterocyclic groups each of these groups comprising a carbon-carbon double bond in conjugation with an electron withdrawing group, as well as metal ion-complexing and water solubilizing groups. The reactive composition can be patternwise exposed to suitable radiation to induce crosslinking within the reactive polymer. The reactive composition and reactive polymer in the non-exposed regions can be removed due to their aqueous solubility, but the exposed regions of the polymeric layer are contacted with electroless seed metal ions, which are then reduced. The resulting electroless seed metal nuclei are electrolessly plated with a suitable metal to form the desired conductive pattern. Various articles can be prepared during this process, and the product article can be incorporated into various electronic devices.

20 Claims, No Drawings

FORMING CONDUCTIVE METAL PATTERNS USING WATER-SOLUBLE POLYMERS

RELATED APPLICATION

Reference is made to copending and commonly assigned U.S. Ser. No. 14/277,334 that was filed May 14, 2014 by Brust, Bennett, and Irving (now issued as U.S. Pat. No. 9,069,248 on Jun. 30, 2015), the disclosure of which is incorporated herein by reference.

FIELD OF THE INVENTION

This invention relates to methods for forming patterns of a reactive polymer that can be used for forming other material patterns such as conductive metallic patterns, for example using electroless plating. The invention is carried out using water-soluble, crosslinkable reactive polymers containing aromatic or non-aromatic unsaturated heterocyclic groups, which reactive polymer can be crosslinked upon suitable irradiation. This invention also relates to precursor, intermediate, and product articles related to the inventive method.

BACKGROUND OF THE INVENTION

In recent decades accompanying rapid advances in information-oriented society, there have also been rapid technological advances to provide devices and systems for gathering and communicating information. Of these, display devices have been designed for television screens, commercial signage, personal and laptop computers, personal display devices, and phones of all types, to name the most common information sharing devices.

As the increase in the use of such devices has exploded in frequency and necessity by displacing older technologies, there has been a concern that electromagnetic radiation emission from such devices may cause harm to the human body or neighboring devices or instruments over time. To diminish the potential effects from the electromagnetic radiation emission, display devices are designed with various transparent conductive materials that can be used as electromagnetic wave shielding materials.

In display devices where a continuous conductive film is not practical for providing this protection from electromagnetic radiation emission, it has been found that conductive mesh or patterns can be used for this electromagnetic wave shielding purpose.

Other technologies have been developed to provide new microfabrication methods to provide metallic, two-dimensional, and three-dimensional structures with conductive metals. Patterns have been provided for these purposes using photolithography and imaging through mask materials.

In addition, as the noted display devices have been developed in recent years, attraction has increased greatly for the use of touch screen technology whereby a light touch on a transparent screen surface with a finger or stylus can create signals to cause changes in screen views or cause the reception or sending of information, telecommunications, interaction with the internet, and many other features that are being developed at an ever-increasing pace of innovation. The touch screen technology has been made possible largely by the use of transparent conductive grids on the primary display so that the location of the noted touch on the screen surface can be detected by appropriate electrical circuitry and software.

For a number of years, touch screen displays have been prepared using indium tin oxide (ITO) coatings to create arrays of capacitive patterns or areas used to distinguish multiple point contacts. ITO can be readily patterned using known semiconductor fabrication methods including photolithography and high vacuum processing. However, the use of ITO coatings has a number of disadvantages. Indium is an expensive rare earth metal and is available in limited supply. Moreover, ITO is a ceramic material and is not easily bent or flexed and such coatings require expensive vacuum deposition methods and equipment. In addition, ITO conductivity is relatively low, requiring short line lengths to achieve desired response rates (upon touch). Touch screens used in large displays are broken up into smaller segments in order to reduce the conductive line length to provide acceptable electrical resistance. These smaller segments require additional driving and sensing electronics, further adding to the cost of the devices.

Silver is an ideal conductor having conductivity that is 50 to 100 times greater than that of ITO. Unlike most metal oxides, silver oxide is still reasonably conductive and its use reduces the problem of making reliable electrical connections. Moreover, silver is used in many commercial applications and is available from numerous commercial sources.

In other technologies, transparent polymeric films have been treated with conductive metals such as silver, copper, nickel, and aluminum by such methods as sputtering, ion plating, ion beam assist, wet coating, as well as the vacuum deposition. However, all of these technologies are expensive, tedious, or extremely complicated so that the relevant industries are spending considerable resources to design improved means for forming conductive patterns for various devices especially touch screen displays.

A similar level of transparency and conductivity for patterns can be achieved by producing very fine lines of about 5-6 μm in width of highly conductive material such as copper or silver metal or conductive polymers.

U.S. Pat. No. 3,677,763 (DeBoer et al.) describes imagewise X-ray exposure of compositions comprising phosphors or fluorescent pigments and polymers with unsaturated cyclic groups. The X-radiation excites the phosphors or fluorescent pigments that generate actinic radiation to cause crosslinking in the polymers. Similar photosensitive compositions and polymers are described in U.S. Pat. No. 3,782,938 (DeBoer) that can be used in lithographic printing plates and photoresists.

U.S. Pat. No. 6,201,087 (Herr et al.) describes the use of coumarin crosslinked polymers in liquid crystal displays. U.S. Patent Application Publication 2011-0215334 (Quinn et al.) describes the use of coumarin groups in crosslinkable polymers for use in dielectric materials. Moreover, U.S. Pat. No. 8,536,300 (Choi) mentions that coumarin may be a possible crosslinking agent for photopatternable conductive polymers.

While a variety of polymers have been developed for providing conductive patterns using electroless plating methods, such polymers are generally insoluble in water and must be coated out of expensive and sometimes toxic organic solvents that have to be removed during manufacture, which organic solvents present an environmental concern.

There is a need for a way to make reactive polymer patterns that can be used for producing thin conductive lines using less expensive materials and plating techniques in order to achieve a substantial improvement in cost, reliability, and availability of conductive patterns for various display devices. It is desirable to achieve these results using aqueous formulations instead of organic solvent coating formulations. The present invention addresses this need as described in considerable detail below.

SUMMARY OF THE INVENTION

To address these needs, the present invention provides a method for forming a pattern in a polymeric layer, the method comprising:

providing a polymeric layer comprising a reactive composition that comprises: (1) a reactive polymer that is metal ion-complexing, water-soluble, and crosslinkable, which reactive polymer comprises pendant photosensitive, aromatic or non-aromatic heterocyclic groups each comprising a carbon-carbon double bond that is conjugated with an electron withdrawing group, and (2) optionally, a photosensitizer, patternwise exposing the polymeric layer to radiation having a $\lambda_{max}$ of at least 150 nm that is sufficient to provide at least partial crosslinking within the reactive polymer, to provide a polymeric layer comprising non-exposed regions and exposed regions comprising a crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the crosslinked polymer in the exposed regions of the polymeric layer, removing the reactive composition comprising the reactive polymer in the non-exposed regions, contacting the exposed regions of the polymeric layer with electroless seed metal ions to form a pattern of electroless seed metal ions in the exposed regions of the polymeric layer, reducing the pattern of electroless seed metal ions to provide a pattern of corresponding electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

The method of this invention can be carried out using a precursor article comprising a substrate and having disposed thereon a polymeric layer comprising a reactive composition that comprises: (1) a reactive polymer that is metal ion-complexing, water-soluble, and crosslinkable, which reactive polymer comprises pendant photosensitive, aromatic or non-aromatic heterocyclic groups each comprising a carbon-carbon double bond that is conjugated with an electron withdrawing group, and, (2) optionally, a photosensitizer.

With the practice of the method of this invention, an intermediate article can be produced, which intermediate article comprises a substrate and having disposed thereon a polymeric layer comprising exposed regions and non-exposed regions, the exposed regions comprising a pattern of at least partially crosslinked polymer that has been derived from a reactive polymer that is metal ion-complexing, water-soluble, and crosslinkable, which reactive polymer comprises pendant photosensitive, aromatic or non-aromatic heterocyclic groups each comprising a carbon-carbon double bond that is conjugated with an electron withdrawing group, and the non-exposed regions comprising a reactive composition that comprises: (1) the reactive polymer, and (2) optionally, a photosensitizer.

Moreover, another intermediate article provided during the practice of this invention comprises a substrate and having disposed thereon a polymeric layer comprising exposed regions and non-exposed regions, the exposed regions comprising a pattern of at least partially crosslinked polymer that has been derived from a reactive polymer that is metal ion-complexing, water-soluble, and crosslinkable, which reactive polymer comprises pendant photosensitive, aromatic or non-aromatic heterocyclic groups each comprising a carbon-carbon double bond that is conjugated with an electron withdrawing group, and the non-exposed regions comprising none of the reactive polymer.

Still again, another intermediate article comprises a substrate and having disposed thereon a polymeric layer comprising exposed regions and non-exposed regions, the exposed regions comprising a pattern of electroless seed metal ions complexed within an at least partially crosslinked polymer that has been derived from a reactive polymer that is metal ion-complexing, water-soluble, and crosslinkable, which reactive polymer comprises pendant photosensitive, aromatic or non-aromatic heterocyclic groups each comprising a carbon-carbon double bond that is conjugated with an electron withdrawing group, and the non-exposed regions comprising none of the electroless seed metal ions or the reactive polymer.

An intermediate article comprises a substrate and having disposed thereon a polymeric layer comprising exposed regions and non-exposed regions, the exposed regions comprising a pattern of electroless seed metal nuclei complexed within an at least partially crosslinked polymer that has been derived from a reactive polymer that is metal ion-complexing, water-soluble, and crosslinkable, which reactive polymer comprises pendant photosensitive, aromatic or non-aromatic heterocyclic groups each comprising a carbon-carbon bond that is conjugated with an electron withdrawing group, and the non-exposed regions comprising none of the electroless seed metal nuclei or the reactive polymer that is metal ion-complexing, water-soluble, and crosslinkable.

The present invention then provides a product article comprising a substrate and having disposed thereon a polymeric layer comprising exposed regions and non-exposed regions, the exposed regions comprising a pattern of electrolessly plated metal complexed within or deposited on the surface of an at least partially crosslinked polymer that has been derived from a reactive polymer that is metal ion-complexing, water-soluble, and crosslinkable, which reactive polymer comprises pendant photosensitive, aromatic or non-aromatic heterocyclic groups each comprising a carbon-carbon double bond that is conjugated with an electron withdrawing group, and the non-exposed regions comprising none of the electrolessly plated metal or the reactive polymer.

The present invention provides fine conductive metal lines without using traditional high-cost semiconductor fabrication methods. It is to obtain these advantages because of the use of a unique reactive polymer that is water-soluble and can therefore be coated and processed using aqueous-based processing solutions. In addition, the unique reactive polymer also comprises the required catalytic metal ion complexing properties and UV radiation-initiated crosslinking functionality such that no additional acid generating or photosensitizing compounds are required. This crosslinking functionality is present in photosensitive, aromatic or non-aromatic heterocyclic groups that comprise a carbon-carbon double bond that is conjugated to at least one electron withdrawing group.

The present invention also has the advantages that some of the photosensitive aromatic or non-aromatic unsaturated heterocyclic groups attached to the ethylenically unsaturated polymerizable monomers used to prepare the reactive polymers described herein are naturally occurring and are readily available as inexpensive starting materials. Other photosensitive aromatic or non-aromatic unsaturated heterocyclic groups attached to the ethylenically unsaturated polymerizable monomers can be prepared using simple and inexpensive starting materials and methods such as aldol or ester condensation reactions with conjugated elimination that can be carried out in a single reaction process under mild reaction conditions.

Use of the specifically designed copolymer described herein can become water-insoluble in the exposed regions of a polymeric layer, and a pattern of water permeable but water-insoluble polymer can be formed on a suitable substrate with the copolymer in the non-exposed regions simply washed away with a suitable water bath. The remaining water-swellable and crosslinked polymer can then be treated with a catalytic metal ion bath such as silver nitrate where the metal ions will complex with the carboxylic acid or other metal ion complexing or reactive groups in the crosslinked polymer. These complexed metal ions can then be reduced in a suitable reducing bath to form catalytic metal particles suitable for electroless metal plating of a variety of metals as described below. The UV radiation initiated crosslinking in the exposed regions forming the desired predetermined pattern is sufficient to keep the pattern from not dissolving in the electroless metal plating baths, while still allowing reactants and products of the electroless plating process to diffuse in and out of the polymer pattern.

The present invention therefore can be used to produce highly conductive metal patterns that exhibit high fidelity or correspondence to the ultraviolet radiation exposing pattern including the ability to easily produce 5 to 6 μm wide (or less) conductive metal lines that exhibit high conductivity (low resistivity).

DETAILED DESCRIPTION OF THE INVENTION

The following discussion is directed to various embodiments of the present invention and while some embodiments can be more desirable for specific uses, the disclosed embodiments should not be interpreted or otherwise considered to limit the scope of the present invention, as claimed below. In addition, one skilled in the art will understand that the following disclosure has broader application than is explicitly described and the discussion of any embodiment is not intended to limit the scope of the present invention.

Definitions

As used herein to define various ethylenically unsaturated polymerizable monomer components (or recurring units) of the reactive polymers, solutions, reactive compositions, aqueous-based solutions, and polymeric layers, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a dictionary.

The use of numerical values in the various ranges specified herein, unless otherwise expressly indicated, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, or layer. Unless otherwise indicated, the percentages can be the same for either a dry layer or pattern, or for the total solids of the formulation or composition.

The term "homopolymer" is meant to refer to polymeric materials that have the same repeating or recurring unit along a polymer backbone. The term "copolymer" refers to polymeric materials composed of two or more different repeating or recurring units that are arranged in any order (randomly or otherwise) along the polymer backbone.

For the reactive polymers used in the present invention, the recurring units can be arranged randomly along the polymer backbone, or there can be blocks of recurring units that occur naturally during the polymerization process.

Recurring units in the reactive polymers described herein are generally derived from the corresponding ethylenically unsaturated polymerizable monomers used in a polymerization process, which ethylenically unsaturated polymerizable monomers have the desired functional and pendant groups. Alternatively, desired pendant groups can be incorporated within recurring units after polymerization of ethylenically unsaturated polymerizable monomers by reaction with requisite precursor pendant groups.

The term "reactive polymer" is used herein to refer to the polymers described below that have the essential components and properties described and can be used in the methods of the present invention to form electrically-conductive patterns.

By "solubility or dispersibility" in reference to the reactive polymer, we mean that a uniform stable solution or dispersion of reactive polymer can be prepared using a desired solvent at a solids concentration that is useful for use in the present invention, for example preparation of coating formulations.

The term "aqueous-based" refers to solutions, baths, or dispersions in which the predominant solvent, or at least 50 weight % of the solvents, is water.

Unless otherwise indicated, the term "mol %" when used in reference to recurring units in reactive polymers, refers to either the nominal (theoretical) amount of a recurring unit based on the molecular weight of ethylenically unsaturated polymerizable monomer used in the polymerization process, or to the actual amount of recurring unit in the resulting reactive polymer as determined using suitable analytical techniques and equipment.

Uses

The materials and methods described or claimed herein can be used to provide reactive polymer patterns that can be used as patterned substrates for further chemical reactions such as the formation of catalytic metal particles or nanoparticles that can then be used to form electrically-conductive metal patterns as described herein, which electrically-conductive metal patterns can be incorporated into various devices including but not limited to touch screen or other display devices.

For example, the reactive compositions described herein can be used for a variety of purposes where efficient photopolymerization and metal pattern formation is needed in various articles or devices. Such reactive compositions must be sensitive to a chosen radiation wavelength as noted above. For example, the reactive compositions can be used in various methods that can provide electrically-conductive metal patterns, for example using electroless plating procedures, which electrically-conductive metal patterns can be incorporated into various devices including but not limited to, touch screen or other display devices that can be used in numerous industrial, consumer, and commercial products.

Touch screen technology can comprise different touch sensor configurations including capacitive and resistive touch sensors. Capacitive touch sensors can be used in electronic devices with touch-sensitive features. These electronic devices can include but are not limited to, televisions, monitors, and projectors that can be adapted to display images including text, graphics, video images, movies, still images, and presentations. The image devices that can be used for these display devices that can include cathode ray tubes (CRT), projectors, flat panel liquid crystal displays (LCD), light emitting diode (LED) systems, organic light emitting diode (OLED) systems, plasma systems, electroluminescent displays (ELD), and field emission displays (FED). For example, the present invention can be used to prepare capacitive touch sensors that can be incorporated into electronic devices with touch-sensitive features to provide computing devices, computer displays, portable media players including e-readers, mobile telephones and other communicating devices.

Systems and methods of fabricating flexible and optically compliant touch sensors in a high-volume roll-to-roll manufacturing process wherein micro electrically-conductive features can be created in a single pass are possible using the present invention. The reactive compositions can be used in such systems and methods with multiple printing members to form multiple high resolution electrically-conductive images from predetermined designs of patterns provided in those multiple printing members. Multiple patterns can be printed on one or both sides of a substrate. For example, one predetermined pattern can be printed on one side of the substrate and a different predetermined pattern can be printed on the opposing side of the substrate. The printed patterns of the photopolymerizable compositions can then be further processed to provide electrically-conductive metal patterns using electroless metal plating.

Reactive Polymers for Pattern Formation

In general, the reactive polymers useful in the practice of this invention have one essential feature. They comprise crosslinkable groups (defined below) that upon exposure to suitable radiation can participate in crosslinking. While the reactive polymers can be supplied as aqueous-based reactive compositions, they are best used when applied to a substrate that can have a large or small surface, including the outer surfaces of inorganic or organic particles and then dried. Thus, the reactive polymers are metal ion-complexing (as described below), water-soluble, and crosslinkable.

The reactive polymers can be either condensation or vinyl polymers as long as the requisite crosslinkable and water-solubilizing groups are connected to and arranged along the reactive polymer backbone. In most embodiments, the useful reactive polymers are vinyl polymers derived from ethylenically unsaturated polymerizable monomers using solution or emulsion polymerization techniques and conditions, initiators, surfactants, catalysts, and solvents, all of which would be readily apparent to one skilled in the art from the teaching provided herein.

The useful reactive polymers generally comprise at least some (a) recurring units arranged along the reactive polymer backbone that comprise pendant photosensitive (crosslinkable), aromatic or non-aromatic heterocyclic groups, each of which comprises a carbon-carbon double bond (>C=C<) that is conjugated with one or more electron withdrawing groups. In many embodiments, the carbon-carbon double bond is conjugated with one or two of the same or different electron withdrawing groups, and most embodiments, the carbon-carbon double bond is conjugated with only one electron withdrawing group.

It is to be understood that the pendant photosensitive, aromatic or non-aromatic heterocyclic groups can be single ring groups formed of carbon and hetero atoms (such as nitrogen, sulfur, and oxygen), or they can be fused ring groups with two or more fused rings formed from carbon and suitable heteroatoms.

Useful electron withdrawing groups that can be conjugated with the carbon-carbon double bond would be readily apparent to one skilled in the art as the term "electron withdrawing" in reference to a chemical group is well known in the art. However, the present invention is particularly useful when such electron withdrawing groups include but are not limited to, carbonyl, ester, thioester, amide, imine, amidine, ether, thioether, and amine groups (or moieties). More generally, the photosensitive (crosslinkable) aromatic or non-aromatic heterocyclic group can be a cyclic group that comprises an α,β-unsaturated ketone, α,β-unsaturated lactone, α,β-unsaturated lactam, α,β-unsaturated ether, α,β-unsaturated thioether, or α,β-unsaturated amine group. Of these types of photosensitive (crosslinkable) aromatic or non-aromatic heterocyclic groups, those containing a carbonyl group are particularly useful.

Particularly useful reactive polymer for the present invention comprise pendant photosensitive, aromatic or non-aromatic heterocyclic groups selected from the group consisting of coumarin, thiocoumarin, quinone, benzoquinone, naphthoquinone, pyran, thiopyran, benzopyran, benzothiopyran, pyranone, thiopyranone, pyridinone, quinoline, and quinolinone groups. Of these photosensitive aromatic or non-aromatic heterocyclic groups, pendant photosensitive coumarin or quinolinone groups are useful and the pendant photosensitive coumarin groups are most useful because they can be readily prepared.

Any of the photosensitive aromatic or non-aromatic heterocyclic groups can be substituted with one or more substituents that will not interfere with the desired properties of the reactive polymer.

In general, useful (a) recurring units can be represented by the following Structure (A):

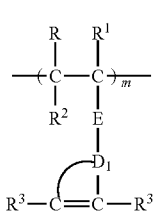

(A)

Specifically, R, $R^1$, and $R^2$ are independently hydrogen or substituted or unsubstituted alkyl groups having at least 1 to 7 carbon atoms (including substituted or unsubstituted methyl, ethyl, isopropyl, t-butyl, hexyl, and benzyl groups, and others that would be readily apparent to one skilled in the art), substituted or unsubstituted cycloalkyl group having 5 or 6 carbon atoms in the ring (such as cyclopentyl, cyclohexyl, 4-methylcyclohexyl, and others that would be readily apparent to one skilled in the art), substituted or unsubstituted phenyl groups (such as phenyl, tolyl, and xylyl groups, and others that would be readily apparent to one skilled in the art), substituted or unsubstituted alkoxy groups having 1 to 7 carbon atoms (such as methoxy, ethoxy, benzoxy, and others readily apparent to one skilled in the art), or substituted or unsubstituted phenoxy groups (such as phenoxy, 2,4-dimethylphenoxy, and others that would be readily apparent to one skilled in the art). In some embodiments, R and $R^1$ can also be nitro, cyano, or halogen groups.

More particularly, R, $R^1$, and $R^2$ are independently hydrogen or substituted or unsubstituted methyl, ethyl or phenyl groups, and more particularly, each of these groups is hydrogen or methyl.

E is a single bond or divalent linking group that can be connected to a carbon atom within $D_1$. Thus, while E appears to be connected directly to $D_1$, E can be connected to any carbon represented by $D_1$. For example, E can be a divalent linking group including but not limited to, substituted or unsubstituted alkylene (including haloalkylenes and cyanoalkylenes), alkyleneoxy, alkoxyalkylene, iminoalkylene, cycloalkylene, aralkylene, cycloalkylene-alkylene, aryloxyalkylene groups wherein the divalent hydrocarbon groups can comprise 1 to 20 carbon atoms (in either linear, branched, or cyclic form), carbonyloxy, oxycarbonyl, amido, keto, carbonate, carbamate, and urea. A skilled worker in polymer chemistry would be able to design other useful linking groups using suitable number of carbon and hetero (oxygen, nitrogen, or sulfur) atoms in an order and arrangement that are chemically possible. Particularly useful E divalent groups are substituted or unsubstituted alkylene groups such as substituted or unsubstituted ethylene or propylenes or oxycarbonyl.

In Structure (A), $D_1$ represents the carbon and hetero (sulfur, oxygen, or nitrogen particularly) atoms necessary to complete a three-membered to fourteen-membered aromatic or non-aromatic heterocyclic group (or ring) that includes the carbon-carbon double bond shown in Structure (A). However, it is essential that either $D_1$ or at least one of the $R^3$ groups (defined below) comprises at least one (and optionally more) electron withdrawing groups that are conjugated with the carbon-carbon double bond shown in Structure (A).

$D_1$ can also represent the saturated or unsaturated carbon or hetero atoms to provide one or more fused rings such as naphthoquinone, benzopyran, benzothiopyran, benzopyran-2-one (coumarin), quinoline, and quinolinone polyrings. Other useful $D_1$ ring systems optionally comprising at least one electron withdrawing group that is conjugated with the carbon-carbon double bond would be readily apparent to one skilled in the art.

Moreover, $R^3$ is hydrogen, a substituted or unsubstituted alkyl group having 1 to 12 carbon atoms (such as methyl, ethyl, isopropyl, amyl, hexyl, nonyl, decyl, and dodecyl), a substituted or unsubstituted aryl group having 6 or 10 carbon atoms in the ring, a substituted or unsubstituted alkoxy group having 1 to 12 carbon atoms (such as methoxy, 2-ethoxy, t-butoxy, and n-hexoxy), substituted or unsubstituted aryloxy group having 6 or 10 carbon atoms in the ring (such as phenoxy and naphthoxy), cyano, halo, or carbonyl-containing group. Such carbonyl-containing groups include but are not limited to, aldehyde, ketone, carboxylic acid, ester, and amide groups. Such carbonyl-containing groups can be conjugated with the carbon-carbon double bond in Structure (A).

In Structure (A), m can represent the molar amounts of the (a) recurring units and can be at least 2 mol % and up to and including 50 mol %, based on the total recurring units in the reactive polymer.

Upon exposure to suitable radiation having a $\lambda_{max}$ of at least 150 nm and up to and including 700 nm, or more likely exposed to radiation having a $\lambda_{max}$ of at least 150 nm and up to and including 450 nm, the noted crosslinkable groups in these (a) recurring units are electronically excited such that they take part in a photocycloaddition reaction or photodimerization reaction.

Some useful (a) recurring units can be derived from:
7-(2-methacryloyloxyethoxy)-4-methylcoumarin,
7-(2-methacryloyloxyethoxy)-coumarin,
7-(3-methacryloyloxysulfopropyl)-4-methylcoumarin,
7-(methacryloyloxy)-4-methylcoumarin,
6-(methacryloyloxy)-4-methylcoumarin,
6-(2-methacryloyloxyethoxy)-4-methylcoumarin,
7-(2-methacryloyloxyethoxy)-quinoline-2-one,
7-(2-methacryloyloxyethoxy)-4-methylquinoline-2-one, and
5-(2-methacryloyloxyethoxy)-naphthoquinone.

The useful (a) recurring units can be derived from suitable ethylenically unsaturated polymerizable monomers that can then be polymerized under suitable conditions to provide useful reactive polymers, as shown below for the Examples.

Particularly useful reactive polymers can comprise (a) recurring units comprising the pendant photosensitive, aromatic or non-aromatic unsaturated carbocyclic groups, and (b) recurring units comprising pendant reactive solubilizing groups, wherein the (a) recurring units are present in an amount of up to and including 50 mol %, and the (b) recurring units are present in an amount of at least 50 mol %, all based on the total recurring units in the reactive polymer.

More particular, the reactive polymers can comprise (a) recurring units in an amount of at least 2 mol % and up to and including 50 mol %, and (b) recurring units in an amount of at least 50 mol % and up to and including 98 mol %, based on the total reactive polymer recurring units.

Useful (b) recurring units can be derived from any ethylenically unsaturated polymerizable monomer that comprises pendant water-solubilizing groups, or pendant precursor groups that can be converted to water-solubilizing groups after polymerization. Such pendant water-solubilizing groups are also generally metal ion-complexing (or metal ion-reactive) and include but are not limited to, pendant carboxylic acid, sulfonic acid, and phosphonic acid groups as well as neutralized salts of these acid groups (such as carboxylate and sulfonate groups). Pendant sulfonic acid, sulfonate, carboxylic acid, and carboxylate groups are particularly useful. Other useful pendant water-solubilizing groups would be readily apparent to one skilled in the art. Useful pendant precursor groups include but are not limited to, anhydrides, esters (such as tertiary alkyl esters), alcohols, and benzyl groups such as iminobenzyl sulfonates and nitrobenzyl sulfonates.

For example, useful (b) recurring units can be represented by the following Structure (B):

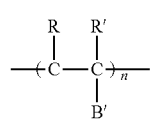

wherein B' represents a pendant group comprising the desired water-solubilizing group (noted above) or precursor groups, which water-solubilizing group can be directly attached to the reactive polymer backbone or it can be attached through a suitable divalent linking group.

For example, some useful ethylenically unsaturated polymerizable monomers from which the (b) recurring units can be derived include but are not limited to, acrylic acid, methacrylic acid, styrene sulfonic acid, itaconic acid, maleic anhydride, fumaric acid, citraconic acid, vinyl benzoic acid, 2-carboxyethyl acrylate, 2-carboxyethyl methacrylate, 2-acrylamido-2-methyl-1-propane sulfonic acid, 2-sulfoethyl methacrylate, 3-sulfopropyl methacrylate, styrene sulfonates, and styrene sulfonic acid. Partially or fully neutralized counterparts of these monomers are also useful.

In addition to the (a) and (b) recurring units described above, the reactive polymers can further comprise one or more additional recurring units that are different from all (a) and (b) recurring units, and herein identified as optional Structure (C) recurring units. A skilled polymer chemist would understand how to choose such additional recurring units, and for example, they can be derived from one or more ethylenically unsaturated polymerizable monomers selected from the group consisting of alkyl acrylates, alkyl methacrylates, (meth)acrylamides, styrene and styrene derivatives, vinyl ethers, vinyl benzoates, vinylidene halides, vinyl halides, vinyl imides, and other materials that a skilled worker in the art would understand could provide desirable properties to the reactive polymer. Such Structure (C) recurring units can be represented as follows:

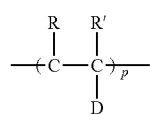

wherein the D groups in the Structure (C) recurring units can be for example, hydrogen, substituted or unsubstituted alkyl groups (such as hydroxyalkyl groups), substituted or unsubstituted aryl groups (such as substituted or unsubstituted phenyl groups including those found in styrene monomers), alkyl ester groups, aryl ester groups, halogens, or ether groups. In many useful Structure (C) recurring units, the D groups are alkyl carboxyl ester groups wherein the alkyl moiety has 1 to 6 carbon atoms and is linear, branched, or cyclic in form.

In addition, some Structure (C) recurring units can comprise an epoxy (such as a glycidyl group) or epithiopropyl group derived for example from glycidyl methacrylate or glycidyl acrylate.

In the recurring units in the noted Structures (B) and (C), R and R' can be the same or different hydrogen, methyl, ethyl, or chloro groups and each type of recurring unit can have the same or different R and R' groups along the polymer backbone. In most embodiments, R and R' are hydrogen or methyl, and R and R' can be the same or different for the various Structure (B) and Structure (C) recurring units in a given reactive polymer. In addition, the R and R' groups in the Structure (B) and (C) recurring units can be the same or different as the R, $R^1$, and $R^2$ groups in the Structure (A) recurring units.

In the Structures (A), (B), and (C) recurring units shown above, "m", "n", and "p" are used to represent the respective molar amounts of recurring units, based on total recurring units, in a given reactive polymer, so that the sum of m, n, and p equal 100 mol % in a given reactive polymer.

In general, m is at least 2 mol %, or even at least 5 mol % and up to and including 50 mol %, or at least 10 mol % and up to and including 40 mol %, based on the total recurring units in the reactive polymer. In addition, n generally represents at least 50 mol % and up to and including 98 mol %, or more typically at least 60 mol % and up to and including 95 mol %, or even at least 70 mol % and up to and including 90 mol %, based on the total recurring units in the reactive polymer.

Moreover, while p can be 0 mol %, it also can be up to and including 40 mol %, or typically at least 1 mol % and up to and including 40 mol %, or at least 5 mol % and up to and including 30 mol %, based on the total recurring units in the reactive polymer.

The mol % amounts of the various recurring units defined herein for the reactive polymers defined herein are meant to refer to the actual molar amounts present in the reactive polymers. It is understood by one skilled in the art that the actual mol % values may differ from those theoretically possible from the amount of ethylenically unsaturated polymerizable monomers that are used in the polymerization procedure. However, under most polymerization conditions that allow high polymer yield and optimal reaction of all monomers, the actual mol % of each monomer is generally within ±15 mol % of the theoretical amounts.

Some representative reactive polymer embodiments include but are not limited to, the following copolymers and terpolymers wherein the molar ratios are theoretical (nominal) amounts based on the actual molar ratio of ethylenically unsaturated polymerizable monomers used in the polymerization process. The actual molar amounts of recurring units can differ from the theoretical (nominal) amounts of monomers if the polymerization reactions are not carried out to completion.

Poly(7-(2-methacryloyloxyethoxy)-4-methylcoumarin-co-methacrylic acid) (20:80 mol ratio);

Poly(7-(2-methacryloyloxyethoxy)-4-methylcoumarin-co-acrylic acid) (30:70 mol ratio);

Poly(7-(2-methacryloyloxyethoxy)-4-methylcoumarin-co-methacrylic acid-co-butyl acrylate) (20:70:10 mol ratio);

Poly(7-(2-methacryloyloxyethoxy)-4-methylcoumarin-co-3-sulfopropylmethacrylate potassium salt) (20:80 mol ratio);

Poly(7-(2-methacryloyloxyethoxy)-4-methylcoumarin-co-methacrylic acid-co-glycidyl methacrylate) (20:75:5 mol ratio);

Poly(7-(2-methacryloyloxyethoxy)-4-methylcoumarin-co-3-sulfopropylmethacrylate potassium salt) (50:50 mol ratio);

Poly(7-(2-methacryloyloxyethoxy)-4-methylcoumarin-co-3-sulfopropylmethacrylate potassium salt-co-methacrylic acid) (20:40:40 mol ratio);

Poly(6-(2-methacryloyloxyethoxy)-4-methylcoumarin-co-methacrylic acid) (20:80 mol ratio);

Poly(6-(2-methacryloyloxyethoxy)-coumarin-co-methacrylic acid) (20:80 mol ratio); and Poly(6-(2-methacryloyloxyethoxy)-4-methylquinoline-2-one-co-methacrylic acid) (20:80 mol ratio).

The reactive polymers useful in the invention generally have a molecular weight ($M_w$) of at least 30,000 and up to and including 1,000,000 as measured by gel permeation chromatography (GPC) or by size exclusion chromatography (SEC).

Examples of reactive polymers can be prepared using known free radical solution polymerization techniques using known starting materials, free radical initiators, and reaction conditions in suitable organic solvents such as dimethyl formamide, N,N-dimethylacetamide, tetrahydrofuran, methyl ethyl ketone, isopropyl alcohol, and various Dowanol® solvents that can be adapted from known polymer chemistry. Where starting materials (such as ethylenically unsaturated polymerizable monomers) are not available commercially, such starting materials can be synthesized using known chemical starting materials and procedures.

Representative preparations of particularly useful reactive polymers are provided below for the Invention Examples. Additional details of polymerization procedures and starting materials can be found in U.S. Pat. No. 3,647,446 (Alsup et al.), U.S. Pat. No. 3,677,763 (DeBoer et al.), U.S. Pat. No. 3,782,938 (DeBoer), and U.S. Pat. No. 3,849,144 (Wadsworth et al.), the disclosure of such details being incorporated herein by reference.

In general, the reactive polymers can be stored in solution in suitable aqueous solutions or dispersions. Depending upon the sensitivity of the reactive polymer to light (such as room light), during and after preparation, the reactive polymers can be kept in the dark or away from light exposure until they are formulated into reactive compositions and used for various purposes.

Reactive Compositions

The reactive polymers described herein can be used in reactive compositions incorporated into polymeric layers in various methods for forming conductive patterns, for example using electroless plating.

Each reactive composition has only one essential component, that is, one or more reactive polymers as described above that can be crosslinked in the crosslinkable groups upon exposure to radiation having $\lambda_{max}$ of at least 150 nm and up to and including 700 nm, or of at least 150 nm and up to and including 450 nm, as described below, and which reactive polymers can also comprise pendant water-solubilizing groups as described above. While various other optional components can be included as described below, only the reactive polymer is essential for providing the desired precursor article, intermediate articles, product articles, and conductive electroless metal plated pattern in the reactive composition forming the polymeric layer as described herein.

One or more reactive polymers as described above are generally present in the reactive composition (and in the resulting dry polymeric layer) in an amount of at least 50 weight % and up to and including 100 weight %, or typically at least 80 weight % and up to and including 98 weight %, based on the total solids in the reactive composition (or total dry weight of the polymeric layer).

The reactive compositions generally do not include separate crosslinking agents or crosslinking agent precursors because the reactive polymer itself includes sufficient crosslinkable groups (described above). However, as noted above, the —C-recurring units can also include additional crosslinking groups.

While not essential, it is sometimes desirable to enhance the sensitivity of some reactive compositions to longer wavelengths (for example, at least 300 nm and up to and including 700 nm, or at least 150 nm and up to and including 450 nm) by including one or more photosensitizers in the reactive composition used in this invention. A variety of photosensitizers are known in the art such as benzothiazole and naphthothiazole compounds as described in U.S. Pat. No. 2,732,301 (Robertson et al.), aromatic ketones as described in U.S. Pat. No. 4,507,497 (Reilly, Jr.), and ketocoumarins, as described for example in U.S. Pat. No. 4,147,552 (Specht et al.) and U.S. Pat. No. 5,455,143 (Ali). Particularly useful photosensitizers for long UV and visible light sensitivity include but are not limited to, 2-[bis(2-furoyl)methylene]-1-methyl-naphtho[1,2-d]thiazoline, 2-benzoylmethylene-1-methyl-β-napthothiazoline, 3,3'-carbonylbis(5,7-diethoxycoumarin), 3-(7-methoxy-3-coumarinoyl)-1-methylpyridinium fluorosulfate, 3-(7-methoxy-3-coumarinoyl)-1-methylpyridinium 4-toluenesulfonic acid, and 3-(7-methoxy-3-coumarinoyl)-1-methylpyridinium tetrafluoroborate. Other useful compounds are described in Columns 6 and 7 of U.S. Pat. No. 4,147,552 (noted above) which compound disclosure is incorporated herein by reference.

One or more photosensitizers can be present in the reactive composition (and resulting dry polymeric layer) in an amount of at least 0.1 weight % and up to and including 10 weight %, or more likely at least 0.5 weight % and up to and including 5 weight %, based on the total solids in the reactive composition (or total dry weight of the polymeric layer).

The reactive compositions can optionally include one or more addenda such as film-forming compounds, surfactants, plasticizers, filter dyes, viscosity modifiers, and any other optional components that would be readily apparent to one skilled in the art, and such addenda can be present in amounts that would also be readily apparent to one skilled in the art.

The essential reactive polymer and any optional compounds described above are generally dissolved or dispersed in water or a mixture of water and water-miscible organic solvents to form a reactive composition that can be applied to a suitable substrate (described below) in a suitable manner. Useful water-miscible organic solvents include but are not limited to, alcohols such as methanol, ethanol, and isopropanol and polyols such as ethylene glycol, propylene glycol, and glycerol.

Articles

The reactive composition described above can be applied to a suitable substrate using any suitable method including but not limited to, spin coating, bead coating, blade coating, curtain coating, or spray coating, from a suitable reservoir to form a polymeric layer. Useful substrates can be chosen for particular use or method as long as the substrate material will not be degraded by the reactive composition or any treatments to which the resulting precursor articles are subjected during the method of this invention. The reactive composition can be applied multiple times if desired to obtain a thicker coating (reactive polymer layer) of the reactive composition, and dried between each coating or dried only after the last application. Water and any water-miscible organic solvents can be removed from the reactive composition using any suitable drying technique.

In general, the final dry coating of reactive composition (polymeric layer) can have an average dry thickness of at least 10 nm and up to and including 1 mm, with a dry thickness of at least 0.1 µm and up to and including 100 µm being more useful. The average dry thickness can be determined by measuring the dry layer thickness in at least 10 different places within a 10 cm by 10 cm square of the dry reactive layer using an electron microscope or other suitable analytical device.

Thus, useful substrates can be composed of glass, quartz, and ceramics as well as a wide variety of flexible materials such as cellulosic papers and polyesters including poly(ethylene terephthalate) and poly(ethylene naphthalate), polycarbonates, polyamides, poly(meth)acrylates, and polyolefins. Useful polymeric substrates can be formed by casting or extrusion methods. Laminates of various substrate materials can also be put together to form a composite substrate. Any of the substrates can be treated to improve adhesion using for example corona discharge, oxygen plasma, ozone or chemical treatments using silane compounds such as aminopropyltriethoxysilane. The substrates can be of any suitable dry thickness including but not limited to at least 10 µm and up to and including 10 mm, depending upon the intended use of the resulting articles.

Particularly useful substrates are composed of poly(ethylene terephthalate) such as biaxially oriented poly(ethylene terephthalate) (PET) films that have broad uses in the electronics market. These PET films, ranging in dry thickness of at least 50 µm and up to and including 200 µm, can also comprise, on at least one side, a polymeric primer layer (also known as a subbing layer, adhesive layer, or binder layer) that can be added prior to or after film stretching. Such polymeric primer layers can comprise poly(acrylonitrile-co-vinylidene chloride-co-acrylic acid), poly(methyl acrylate-co-vinylidene chloride-co-itaconic acid), poly(glycidyl methacrylate-co-butyl acrylate), or various water-dispersible polyesters, water-dispersible polyurethanes, or water-dispersible polyacrylics, as well as sub-micrometer silica particles. The dry thickness of the primer layer can be at least 0.1 µm and up to and including 1 µm.

Thus, with the application of the described reactive composition to a suitable substrate, with or without appropriate drying, the present invention provides a precursor article comprising a substrate and having disposed thereon a polymeric layer comprising the reactive composition described above that comprises the reactive polymer that is metal ion-complexing, water-soluble, and crosslinkable, and optionally, a photosensitizer.

Uses of Reactive Compositions

The reactive compositions described herein can be used to form reactive polymer patterns (or patterns of the reactive compositions) that can be used as described below to form surface conductive patterns for various purposes as described above. The following discussion provides some details about representative electroless plating methods in which the reactive compositions described herein can be used.

In these electroless plating methods, each aqueous-based "processing" solution, dispersion, or bath (for example, solutions containing electroless seed metal ions, reducing agent solutions, and solutions for electroless plating, as well as rinsing solutions) used at various points can be specifically designed with essential components as well as optional addenda that would be readily apparent to one skilled in the art. For example, one or more of those aqueous-based processing solutions can include such addenda as surfactants, anti-coagulants, anti-corrosion agents, anti-foamants, buffers, pH modifiers, biocides, fungicides, and preservatives. The aqueous-based reducing solutions can also include suitable antioxidants.

The method of this invention for forming a pattern in a polymeric layer comprises:

providing a polymeric layer (as in forming the described precursor article), the polymeric layer comprising the reactive composition described above, comprising a reactive polymer as described above, and optionally a photosensitizer. This polymeric layer can be formed on a suitable substrate, if desired, as described above by suitable application of the reactive composition, after which the reactive composition is typically dried before the resulting precursor article is used in the method of this invention.

This polymeric layer in the precursor article, usually in dry form, can be then patternwise exposed to radiation having a $\lambda_{max}$ of at least 150 nm and up to and including 700 nm or to radiation having a $\lambda_{max}$ of at least 150 nm and up to and including 450 nm, to provide a polymeric layer comprising non-exposed regions and exposed regions comprising at least partially crosslinked polymer. This exposure can be provided with any suitable exposing source or device that provides the desired radiation including but not limited to, various arc lamps and LED sources. The particular exposing source can be chosen depending upon the absorption characteristics of the reactive composition used. The exposing radiation can be projected through lenses and mirrors or through a lens or mask element that can be in physical contact or in proximity with the outer surface of the polymeric layer. Exposure time can range from a fraction (0.1) of a second and up to and including 10 minutes depending upon the intensity of the radiation source and the reactive composition. Suitable masks can be obtained by known methods including but not limited to photolithographic methods, flexographic methods, or vacuum deposition of a chrome mask onto a suitable substrate such as quartz or high quality optical glass followed by photolithographic patterning.

It is optional but desirable to heat or bake the polymeric layer in the precursor article simultaneously with or after the patternwise exposure but generally before removing the reactive composition as described below, at a temperature sufficient to further crosslink the at least partially crosslinked polymer in the exposed regions of the polymeric layer. In most embodiments, this heating is carried out at least after the patternwise exposure of the polymeric layer, but it can be carried out both during and after the patternwise exposure of the polymeric layer. Such heating can be accomplished on a hot plate with vacuum suction to hold the precursor article in close contact with the heating surface. Alternatively, the heating device can be a convection oven. The duration of the heating procedure is generally less than 10 minutes with heating for least 10 seconds and up to and including 5 minutes being most likely. The optimal heating time and temperature can be readily determined with routine experimentation depending upon the particular reactive composition.

This results in an intermediate article of this invention comprising a substrate and having disposed thereon a polymeric layer comprising exposed regions and non-exposed regions, the exposed regions comprising a pattern of at least partially crosslinked polymer that has been derived from a reactive polymer that is metal ion-complexing, water-soluble, and crosslinkable, which reactive polymer comprises pendant groups comprising photosensitive, aromatic or non-aromatic unsaturated heterocyclic groups, as defined above, and the non-exposed regions comprising a reactive composition that comprises the reactive polymer, and optionally, a photosensitizer as described above.

The polymeric layer is generally hydrophilic in the crosslinked and exposed regions such that immersion in aqueous-based solutions (described below) will allow the aqueous molecules, ions, or reagent molecules to rapidly diffuse into the exposed regions.

After the imagewise exposure and optional heating procedures, the reactive composition comprising the reactive polymer can be removed from the non-exposed regions in the intermediate article so that there is essentially no (less than 20%, and particularly less than 10%, by weight of the original amount) reactive composition remaining on the substrate. This can be done by washing, spraying, or immersing the intermediate article in water, aqueous alkaline solution, or another aqueous solution for a suitable time and temperature to remove most or all of the reactive composition from the non-crosslinked, non-exposed regions of the polymeric layer. Contact with the aqueous solution can be carried out for a suitable time and temperature so that reactive composition is desirably removed in the non-exposed regions but little removal occurs in the exposed regions containing the crosslinked polymer. For example, the contact time can be at least 10 seconds and up to and including 10 minutes, and the contact temperature can be at room temperature (about 20° C.) and up to and including 95° C.

This procedure thus provides another intermediate article of this invention, comprising a substrate and having disposed thereon a polymeric layer comprising exposed regions and non-exposed regions, the exposed regions comprising a pattern of at least partially crosslinked polymer that has been derived from a reactive polymer in a reactive composition as defined above, and the non-exposed regions comprising substantially no reactive composition.

Once the reactive composition has been removed from the non-exposed regions, the exposed regions of the polymeric layer can be contacted with an aqueous-based solution or dispersion of electroless seed metal ions to form a pattern of electroless seed metal ions in the exposed regions of the polymeric layer. There are various ways that this contacting can be carried out. Typically, the entire intermediate article is immersed within a dilute aqueous-based solution, bath, or dispersion of the electroless seed metal ions for a sufficient time to coordinate the optimum number of electroless seed metal ions within the crosslinked polymer that has been derived from the reactive polymer described above. For example, this contact with the electroless seed metal ions can be carried out for at least 1 second and up to and including 30 minutes, at room temperature (about 20° C.) or at a higher temperature of up to and including 95° C. The time and temperature for this contact can be optimized for a given reactive composition and electroless seed metal ions that are to be used.

Representative electroless seed metal ions that can be used in these procedures are selected from the group consisting of silver ions, platinum ions, palladium ions, gold ions, tin ions, rhodium ions, iridium ions, nickel ions, and copper ions. Most noble metal ions can serve as electroless seed metal ions in the present invention. These electroless seed metal ions can be provided in the form of a suitable metal salt or metal-ligand complex (that can have an overall positive, negative, or neutral charge). Useful materials of this type include but are not limited to, metal salts and metal-ligand complexes of nitrates, halides, acetates, cyanides, thiocyanates, amines, nitriles, and sulfates. Thus, the electroless seed metal ions can be provided from simple salts or in the form of metal-ligand complexes. The amount of metal salts or metal-ligand complexes present in the aqueous-based solution would be readily apparent to one skilled in the art and can be optimized for a particular reactive composition and exposure procedure. For example, the metal salts or metal-ligand complexes can be present in the aqueous-based solution in an amount sufficient to provide at least 0.00001 molar and up to and including 2 molar of the desired electroless metal ions. In one embodiment, a 0.4 molar silver nitrate solution can be used at room temperature to provide electroless seed silver ions. In another embodiment, a 0.001 molar palladium chloride solution is used to provide electroless metal palladium ions.

The contact with the electroless seed metal ions produces an intermediate article comprising a substrate and having disposed thereon a polymeric layer comprising exposed regions and non-exposed regions, the exposed regions comprising a pattern of electroless seed metal ions complexed within the at least partially crosslinked polymer derived from a reactive polymer in a reactive composition described above, and the non-exposed regions comprising substantially no electroless seed metal ions or reactive composition as described above.

After the requisite time to react the electroless seed metal ions within the at least partially crosslinked polymer in the exposed regions, the polymeric layer can be rinsed with distilled or deionized water or another aqueous-based solution for a suitable time and at a suitable temperature, for example usually room temperature or slightly higher.

After forming the pattern of electroless seed metal ions, the electroless seed metal ions can be reduced to provide a pattern of the corresponding electroless seed metal nuclei in the exposed regions of the polymeric layer. This can be done by contacting the polymeric layer (or at least the exposed regions) with a suitable reducing agent for the electroless seed metal ions. For example, the intermediate article comprising the polymeric layer can be immersed within an aqueous-based reducing solution containing one or more reducing agents for a suitable time to cause sufficient metal ion reduction. Alternatively, an aqueous-based reducing solution comprising the reducing agent can be sprayed or rolled uniformly onto the polymeric layer.

Useful reducing agents include but are not limited to, an organic borane, an aldehyde such as formaldehyde, aldehyde sugar, hydroquinone, or sugar (or polysaccharide) such as ascorbic acid, and metal ions such as tin(II). These reducing agents can be used individually or in combination, and the total amount in the aqueous-based reducing solution used for the reducing procedure can be at least 0.01 weight % and up to and including 20 weight % based on the total reducing solution weight. The amount of reducing agent to be used will depend upon the particular electroless seed metal ions and reducing agent to be used, and this can be readily optimized using routine experimentation. The time and temperature for the reduction can also be readily optimized in the same manner. Generally, the reducing temperature is at least room temperature (about 20° C.) and up to and including 95° C. and the reducing time can be for at least 1 second and up to and including 30 minutes.

For example, some embodiments of the present invention can be carried out using an immersion bath comprising 1 reducing solution weight % of an organic borane such as dimethylamine borane (DMAB) at room temperature for up to 3 minutes. Longer or shorter times at higher temperatures are possible if needed.

After this reducing procedure, the polymeric layer, especially the exposed regions, can be again washed using distilled water or deionized water or another aqueous-based solution at a suitable temperature for a suitable time.

At this point, the method of this invention has provided yet another intermediate article, comprising a substrate and having disposed thereon a polymeric layer comprising exposed regions and non-exposed regions, the exposed regions comprising a pattern of corresponding electroless seed metal nuclei within the at least partially crosslinked polymer that has been derived from the reactive polymer in the reactive composition described above, and the non-exposed regions comprising substantially no electroless seed metal nuclei or reactive composition as described above.

This intermediate article can be immediately immersed in an aqueous-based electroless metal plating bath or solution, or the intermediate article can be stored with just the catalytic pattern comprising corresponding electroless seed metal nuclei for use at a later time.

The intermediate article can be contacted with an electroless plating metal that is the same as or different from the corresponding electroless seed metal nuclei. In most embodiments, the electroless plating metal is a different metal from the corresponding electroless seed metal nuclei.

Any metal that will likely electrolessly "plate" on the corresponding electroless seed metal nuclei can be used at this point, but in most embodiments, the electroless plating metal can be for example copper(II), silver(I), gold(IV), palladium(II), platinum(II), nickel(II), chromium(II), and combinations thereof. Copper(II), silver(I), and nickel(II) are particularly useful electroless plating metals.

The one or more electroless plating metals can be present in the aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure, the resulting product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of corresponding electroless seed metal nuclei that have been electrolessly plated with the same or different metal within the at least partially crosslinked polymer derived from the reactive polymer in a reactive composition as described above, and the non-exposed regions comprising substantially no electrolessly plated metal or reactive composition as described above.

To change the surface of the electroless plated metal for visual or durability reasons, it is possible that a variety of post-treatments can be employed including surface plating of still at least another (third or more) metal such as nickel or silver on the electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, it may be desirable to treat the electrolessly plated metal with a seed metal catalyst in an aqueous-based seed metal catalyst solution to facilitate deposition of additional metals.

As one skilled in the art should appreciate, the individual treatment features or steps described above for this method can be carried out two or more times before proceeding to the next procedure or step. For example, the treatment with the aqueous-based solution containing electroless seed metal ions can be carried out two or more times in sequence, for example, with a rinsing step between sequential treatments. The electroless seed metal ions can be the same or different for the sequential treatments and the treatment conditions can be the same or different.

In addition, multiple treatments with an aqueous-based reducing solution or aqueous-based electroless metal plating solution can be carried out in sequence, using the same or different conditions. Sequential washing or rinsing steps can also be carried out where appropriate.

Further, the electroless plating procedures can be carried out multiple times, in sequence, using the same or different electroless plating metal and the same or different electroless plating conditions.

The reactive polymers and reactive compositions described above can also be used in additional patterning methods described as follows:

Electroless Plating Method 2:

This method can be used to form a pattern in a polymeric layer, the method comprising:

providing a polymeric layer comprising a reactive composition that comprises: (1) a reactive polymer, and (2) optionally, a photosensitizer, as described above, patternwise exposing the polymeric layer to radiation having a $\lambda_{max}$ of at least 150 nm that is sufficient to induce crosslinking within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the exposed regions of the polymeric layer, removing the reactive composition comprising the reactive polymer in the non-exposed regions, incorporating a reducing agent into the exposed regions of the polymeric layer, contacting the exposed regions of the polymeric layer with electroless seed metal ions to oxidize the reducing agent in the exposed regions of the polymeric layer and to form a pattern of electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

The polymeric layer in a precursor article, usually in dry form, can be then patternwise exposed to radiation having a $\lambda_{max}$ of at least 150 nm and up to and including 450 nm or to radiation having a $\lambda_{max}$ of at least 150 nm and up to and including 400 nm, as described above.

It is optional but desirable to heat or bake the reactive composition in the precursor article simultaneously with or after the patternwise exposure but generally before contacting the exposed polymeric layer with the aqueous-based reducing solution (described below) and conditions as described above.

Generally immediately after the patternwise exposing or optional heating procedures, the reactive composition in the non-exposed regions of the polymeric layer is removed as described above in prior methods. Upon this removal of reactive composition from the non-exposed regions of the polymeric layer, the various articles described herein will contain crosslinked polymer in the exposed regions of the polymeric layer.

At this point, an intermediate article has been created in which the exposed regions of the polymeric layer on the substrate comprise crosslinked polymer derived from the reactive polymer in the reactive composition as described herein, and the non-exposed regions of the polymeric layer comprise little or no reactive composition (less than 10 weight % of the original amount).

After the exposure and optional heating, the exposed regions of the polymeric layer are contacted with an aqueous-based reducing solution containing one or more reducing agents and conditions, as described above. In the exposed regions, the reducing agent can diffuse into the crosslinked polymer provided during irradiation or the reactive composition described herein. In the non-exposed regions, the reducing agent does not readily diffuse into or attach to the substrate or support where the non-crosslinked reactive polymer had been removed.

After this reducing procedure, the polymeric layer, especially the exposed regions, can be again washed using distilled water or deionized water or another aqueous-based solution at a suitable temperature for a suitable time.

At this point, an intermediate article is provided, which intermediate article comprises a substrate and having disposed thereon a polymeric layer comprising exposed regions and non-exposed regions, the exposed regions comprising a pattern of a crosslinked polymer derived from the reactive polymer in the reactive composition described herein, and comprising reducing agent dispersed within the crosslinked polymer, and the non-exposed regions comprising substantially no reactive composition.

Once the patternwise exposure, optional heating, and contacting with the reducing agent have been carried out, the exposed regions of the polymeric layer can be contacted with an aqueous-based solution or dispersion of electroless seed metal ions to form electroless seed metal nuclei in the exposed regions of the polymeric layer using aqueous-based solutions and conditions as described above. These electroless seed metal nuclei form catalytic sites for electroless metal plating (deposition of metal) described below.

The contact with the electroless seed metal ions produces an intermediate article comprising a substrate and having disposed thereon a polymeric layer comprising exposed regions and non-exposed regions, the exposed regions comprising a pattern of electroless seed metal nuclei within the crosslinked polymer resulting from the irradiation of the reactive polymer in the reactive composition described herein, and the non-exposed regions comprising substantially no reactive composition.

After the requisite time to react within the resulting crosslinked polymer in the exposed regions, the polymeric layer can be rinsed with distilled or deionized water or other aqueous-based solution for a suitable time and at a suitable temperature, usually room temperature or slightly higher.

The resulting intermediate article can be immediately immersed in an aqueous-based electroless plating bath or solution or the immediate article can be stored with the catalytic pattern comprising corresponding electroless seed metal nuclei for use at a later time. The intermediate article can be contacted with an electroless plating metal that is the same as or different from the corresponding electroless seed metal nuclei, using aqueous-based solutions and conditions as described above.

After the electroless plating procedure, a product article is removed from the aqueous-based electroless plating bath and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of an electroless seed metal nuclei (for example, in a pattern) that have been electrolessly plated with the same or different metal, and crosslinked polymer resulting from irradiation of the reactive polymer in the reactive composition described above, and the non-exposed regions comprising substantially no reactive composition.

Electroless Plating Method 3:

This method can be used to form a pattern in a polymeric layer, the method comprising:

providing a polymeric layer comprising a reactive composition that comprises: (1) a reactive polymer, and (2) optionally, a photosensitizer, as described above, patternwise exposing the polymeric layer to radiation having a $\lambda_{max}$ of at least 150 nm that is sufficient to induce crosslinking within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the exposed regions of the polymeric layer, removing the reactive composition comprising the reactive polymer in the non-exposed regions, contacting both the non-exposed regions and the exposed regions of the polymeric layer with a reducing agent, bleaching the polymeric layer to remove surface amounts of the reducing agent in both non-exposed regions wherein the non-crosslinked reactive polymer had been removed, and exposed regions comprising crosslinked polymeric layer, contacting the exposed regions of the polymeric layer with electroless seed metal ions to oxidize the reducing agent and to form a pattern of electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

Thus, in this method that includes providing a polymeric layer (as in forming the described precursor article), the polymeric layer comprises a reactive composition comprising a reactive polymer and optionally, a photosensitizer, all as described above.

This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 400 nm, as described above.

It is optional but desirable to heat or bake the reactive composition in the precursor article simultaneously with or after the patternwise exposure but generally before contacting the exposed polymeric layer with electroless seed metal ions (described below), as described above.

Generally immediately after the patternwise exposing or optional heating procedures, the reactive composition remaining in the non-exposed regions of the polymeric layer is removed as described above in previous methods (at least 90 weigh % of the original amount).

At this point, an intermediate article has been created in which the exposed regions of the polymeric layer on the substrate comprise crosslinked polymer derived from the reactive polymer in the reactive composition described above, and the non-exposed regions of the polymeric layer comprise little or no reactive composition.

After the exposure and optional heating, the exposed regions of the polymeric layer are contacted with an aqueous-based reducing solution containing one or more suitable reducing agents using aqueous-based solutions and conditions as described above. In the exposed regions, the reducing agent can diffuse into the crosslinked polymer. In the non-exposed regions, the reducing agent does not readily diffuse into the substrate wherein the non-exposed reactive composition has been removed but will become attached to the surface of the substrate.

After this reducing procedure, the polymeric layer, especially the exposed regions, can be again washed using distilled water or deionized water or another aqueous-based solution at a suitable temperature for a suitable time.

At this point, an intermediate article is provided, which intermediate article comprises a substrate and having disposed thereon a polymeric layer comprising exposed regions and non-exposed regions, the exposed regions comprising a crosslinked polymer derived from the reactive polymer in the reactive composition described above, into which a reducing agent has diffused, and the non-exposed regions comprising substantially no reducing agent and reactive composition (less than 10 weight % of the original amount).

Once patternwise exposure, optional heating, and the reducing procedure have been carried out, the polymeric layer can be contacted with an aqueous-based bleaching (or oxidizing) solution comprising one or more bleaching agents, thereby removing surface amounts of the reducing agent in both non-exposed regions comprising primarily the substrate after removal of the non-crosslinked reactive polymer, and exposed regions of the polymeric layer. The term "bleaching" refers to oxidizing the reducing agent molecules to make them inactive for further reaction (thus, they cannot reduce the seedless metal ions when bleached).

Useful bleaching agents for this bleaching procedure can be chosen depending upon the reducing agent that is used in the previous operation. Representative bleaching agents include but are not limited to, peroxides such as hydrogen peroxide, persulfates, iron(III) complexes, and combinations thereof. Hydrogen peroxide is particularly useful. In general, the one or more bleaching agents are present in the aqueous-based bleaching solution in an amount of at least 0.01 weight % and up to and including 20 weight %, based on total aqueous-based bleaching solution weight.

In general, bleaching the polymeric layer is carried out in sufficient time and temperature so that the aqueous-based bleaching solution reacts with (deactivates) or removes at least 90 mol % (or typically at least 95 mol %) of the reducing agent in the non-exposed regions and less than 40 mol % (or typically less than 25 mol %) in the exposed regions of the polymeric layer. The useful time and temperature conditions needed to achieve these results would be readily determined with routine experimentation in view of the teaching provided herein.

At this point, the present invention provides an intermediate article, comprising a substrate and having disposed thereon a polymeric layer comprising exposed regions and non-exposed regions, the exposed regions comprising a pattern of non-oxidized reducing agent molecules within the crosslinked polymer resulting from the irradiation of the reactive polymer in the reactive composition described herein, and the non-exposed regions comprising substantially no reactive composition.

Once the previous operations have been carried out, the exposed regions of the polymeric layer can be contacted with an aqueous-based solution or dispersion containing electroless seed metal ions to oxidize the reducing agent and to form corresponding electroless seed metal nuclei (for example in a pattern) in the exposed regions of the polymeric layer using aqueous-based solutions and conditions as described above. These corresponding electroless seed metal nuclei form catalytic sites for electroless metal plating (deposition of metal) described below.

The contact with the electroless seed metal ions produces an intermediate article comprising a substrate and having disposed thereon a polymeric layer comprising exposed regions and non-exposed regions, the exposed regions comprising a pattern of corresponding electroless seed metal nuclei within the crosslinked polymer resulting from irradiation of the reactive polymer in the reactive composition described herein, and the non-exposed regions comprising substantially no reactive composition.

After the requisite time to react the electroless seed metal ions within the resulting crosslinked polymer in the exposed regions, the polymeric layer can be rinsed with distilled or deionized water or another aqueous-based solution for a suitable time and at a suitable temperature, usually room temperature or slightly higher.

The resulting intermediate article can be immediately immersed in an aqueous-based electroless plating bath or solution or it can be stored with just the catalytic pattern comprising electroless seed metal for use at a later time.

The article can be contacted with an electroless plating metal that is the same as or different from the electroless seed metal using aqueous-based solutions and conditions as described above. In most embodiments, the electroless plating metal is a metal different from the corresponding electroless seed metal nuclei.

After the electroless plating procedure, the product article is removed from the aqueous-based electroless plating bath and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of a corresponding electroless seed metal nuclei within the crosslinked polymer derived from the reactive polymer in the reactive composition described herein, which has been electrolessly plated with the same or different metal, and the non-exposed regions comprising substantially no reactive composition or electroless seed metal nuclei.

Electroless Plating Method 4:

This method can be used to form a pattern in a polymeric layer, the method comprising:

providing a polymeric layer comprising a reactive composition that comprises: (1) a reactive polymer, and (2) optionally, a photosensitizer, as described above, patternwise exposing the polymeric layer to radiation having a $\lambda_{max}$ of at least 150 nm that is sufficient to induce crosslinking within the reactive polymer, to provide a polymeric layer comprising non-exposed regions and first exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the first exposed regions of the polymeric layer, removing the reactive composition comprising the reactive polymer in the non-exposed regions (at least 90 weight % of the original amount), contacting the first exposed regions of the polymeric layer with electroless seed metal ions to form electroless seed metal ions in the first exposed regions of the polymeric layer, contacting the first exposed regions of the polymeric layer with a halide to react with the electroless seed metal ions and to form corresponding electroless seed metal halide in the first exposed regions of the polymeric layer, optionally exposing the polymeric layer to convert at least some of the corresponding electroless seed metal halide in the first exposed regions to corresponding electroless seed metal nuclei and to form second exposed regions in the polymeric layer, optionally contacting the polymeric layer with a reducing agent either: (i) to develop the corresponding electroless seed metal image in the second exposed regions of the polymeric layer, or (ii) to develop all of the corresponding electroless seed metal halide in the first exposed regions, optionally contacting the polymeric layer with a fixing agent to remove any remaining corresponding electroless seed metal halide in either the first exposed regions, the second exposed regions, or both of the first exposed regions and the second exposed regions, and electrolessly plating the corresponding electroless seed metal nuclei in the first exposed regions, the second exposed regions, or both the first exposed regions and the second exposed regions, of the polymeric layer with a metal that is the same as or different from the corresponding electroless seed metal nuclei.

Such method is carried out by providing a polymeric layer (as in forming the described precursor article), the polymeric layer comprising the reactive composition described above. This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 400 nm, as described above to provide a polymeric layer comprising non-exposed regions and first exposed regions comprising a crosslinked polymer.

It is optional but desirable to heat or bake the reactive composition in the precursor article simultaneously with or after the patternwise exposure but generally before removing the non-crosslinked reactive polymer in the non-exposed regions.

Generally immediately after the patternwise exposing or optional heating procedures, the reactive composition remaining in the non-exposed regions of the polymeric layer is removed as described above for other methods (at least 90 weight % of the original amount). Upon this removal of reactive composition from the non-exposed regions of the polymeric layer, the various articles described herein will contain crosslinked polymer in the exposed regions of the polymeric layer.

At this point, an intermediate article has been created in which the first exposed regions of the polymeric layer on the substrate comprise crosslinked polymer derived from the reactive polymer in the reactive composition described above, and the non-exposed regions of the polymeric layer comprise substantially no reactive composition.

Once patternwise exposure and optional heating have been carried out, the first exposed regions of the polymeric layer are contacted with electroless seed metal ions to form coordinated electroless seed metal ions in the first exposed regions of the polymeric layer using aqueous-based solutions and conditions described above.

The contact with the electroless seed metal ions produces an intermediate article comprising a substrate and having disposed thereon a polymeric layer comprising first exposed regions and non-exposed regions, the first exposed regions comprising a pattern of electroless seed metal ions within the crosslinked polymer resulting from irradiation of the reactive polymer in the reactive composition described above, and the non-exposed regions comprising substantially no reactive composition.

After the requisite time to react the electroless seed metal ions within the crosslinked polymer in the first exposed regions, the polymeric layer can be rinsed with distilled or deionized water or another aqueous-based solution for a suitable time and at a suitable temperature, usually room temperature or slightly higher.

At least the first exposed regions of the polymeric layer are then contacted with a halide that reacts with the seed metal ions to form corresponding electroless seed metal halide in the first exposed regions of the polymeric layer. Halides can be provided as suitable halide salts to provide iodide ions, chloride ions, or bromide ions or a combination of two or more of these halides to form electroless seed metal halide in the first exposed regions of the polymeric layer. Chloride ions, iodide ions, or bromide ions or mixtures thereof are particularly useful.

This contacting with a halide can be carried out by immersing the intermediate article described above within an aqueous-based halide bath or halide solution of a suitable halide salt, or the aqueous-based halide solution can be sprayed or coated onto the polymeric layer in a uniform or patternwise manner. The time for this halide treatment can be at least 1 second and up to and including 30 minutes, and the temperature for the halide treatment can be room temperature (about 20° C.) and up to and including 95° C. The time and temperature and the type and amount of halide in a treatment bath can be optimized in order to provide the sufficient amount of corresponding electroless seed metal halide in the first exposed regions of the polymeric layer.

At this point, an intermediate article has been created, which intermediate article comprises a substrate and having thereon a polymeric layer comprising first exposed regions and non-exposed regions, the first exposed regions of the polymeric layer comprising a pattern of corresponding electroless seed metal halide in the crosslinked polymer derived from the reactive polymer in the reactive composition described above, and the non-exposed regions comprising substantially no reactive composition.

After this halide treatment, the polymeric layer can be optionally exposed again to convert at least some, or typically at least 20% (or more typically at least 50%), of the corresponding electroless seed metal halide in first exposed regions of the polymeric layer to corresponding electroless seed metal nuclei using radiation having a $\lambda_{max}$ of at least 150 nm and up to and including 450 nm, or more likely having a $\lambda_{max}$ of at least 240 nm and up to and including 450 nm. The second exposed regions can be the same as or different from the first exposed regions, or the first and second exposed regions can partially overlap.

With this second exposure, the method can provide yet another intermediate article comprising a substrate and having disposed thereon a polymeric layer comprising first exposed regions, second exposed regions, and non-exposed regions, the first exposed regions comprising corresponding electroless seed metal halide in the crosslinked polymer derived from the reactive polymer in the reactive composition described above, the second exposed regions comprising a pattern of corresponding electroless seed metal with a latent image in the crosslinked polymer derived from the reactive polymer in the reactive composition described above, and the non-exposed regions comprising substantially no reactive composition as described above.

The polymeric layer comprising corresponding electroless seed metal halide in the first exposed regions, or corresponding electroless seed metal latent image in the second exposed regions, or both corresponding electroless seed metal halide in the first exposed regions and corresponding electroless seed metal latent image in the second exposed regions are then optionally contacted with a suitable aqueous-based reducing solution comprising one or more reducing agents using aqueous-based solutions and conditions as described above.

After this reducing procedure, the polymeric layer, especially the first exposed regions or the second exposed regions, can be again washed using distilled water or deionized water or another aqueous-based solution for a suitable time to remove excess reducing agent.

The reducing procedure can provide another intermediate article that comprises a substrate and having thereon a polymeric layer comprising first exposed regions, second exposed regions, and non-exposed regions, the first exposed regions of the polymeric layer comprising a pattern of corresponding electroless seed metal halide in a crosslinked polymer derived from the reactive polymer in the reactive composition described above, the second exposed regions of the polymeric layer comprising a pattern of corresponding electroless seed metal nuclei in the crosslinked polymer derived from the reactive polymer in the reactive composition described above, and the non-exposed regions of the polymeric layer comprising substantially no reactive composition.

The polymeric layer comprising corresponding electroless seed metal halide in the first exposed regions, or corresponding electroless seed metal nuclei in the second exposed regions, or both corresponding electroless seed metal halide in the first exposed regions and corresponding electroless seed metal nuclei in the second exposed regions, are then optionally contacted with a suitable fixing agent. This contact removes any remaining corresponding electroless seed metal halide from both the first exposed regions and the second exposed regions of the polymeric layer, while leaving behind any corresponding electroless seed metal nuclei in the second exposed regions.

This contact with a fixing agent can be done by immersing the polymeric layer (or at least the first and second exposed regions) within an aqueous-based fixing solution containing one or more fixing agents for a suitable time to cause the desired change (removal of the corresponding electroless metal halide) in the first exposed regions and the second exposed regions. Alternatively, an aqueous-based fixing solution can be sprayed or rolled uniformly onto the polymeric layer to accomplish the same results.

Useful fixing agents include but are not limited to, sulfites, thiocyanates, thiosulfates, thioureas, halides, ammonia, chelates such as ethylenediaminetetracetic acid, and mixtures thereof. Fixing accelerators can also be included in the aqueous-based fixing solutions, which compounds include, but are not limited to, thioethers and mercaptotriazoles. The fixing agents can be present as salts (that is alkali metal or ammonium salts) as is well known in the art, for instance as described in Research Disclosure December 1978 publication 38957. The total amount of fixing agents in the aqueous-based fixing solution can be at least 0.01 weight % and up to and including 50 weight % based on total fixing solution weight. The fixing agent amount can be readily optimized using routine experimentation. The fixing time and temperature can also be readily optimized in the same manner. Generally, the fixing temperature is at least room temperature (about 20° C.) and up to and including 95° C. and the reducing time can be for at least 1 second and up to and including 30 minutes.

For example, some embodiments of the present invention can be carried out using an aqueous-based fixing solution comprising 20 solution weight % of sodium thiosulfate in combination with 1.5 solution weight % of sodium sulfite at room temperature for 3 minutes. Longer or shorter times at higher temperatures are possible.

After this fixing procedure, the polymeric layer, especially the first exposed regions or the second exposed regions, can be again washed using distilled water or deionized water or another aqueous-based solution for a suitable time to remove excess fixing agent.

The fixing procedure can provide another intermediate article that comprises a substrate and having thereon a polymeric layer comprising first exposed regions, second exposed regions, and non-exposed regions, the first exposed regions of the polymeric layer from which the pattern of corresponding electroless seed metal halide has been removed, the first exposed regions comprising the crosslinked polymer being derived from a reactive polymer in a reactive composition as described above, the second exposed regions of the polymeric layer comprising a pattern of corresponding electroless seed metal nuclei in the crosslinked polymer being derived from a reactive polymer in a reactive composition as described above, and the non-exposed regions of the polymeric layer comprising substantially no reactive composition.

The intermediate article that has been treated as described above can be immediately immersed in an aqueous-based electroless metal plating bath or solution using conditions and aqueous-based solutions described above, or the treated article can be stored with just the catalytic pattern comprising corresponding electroless seed metal nuclei for use at a later time.

After the electroless plating procedure, the product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising first exposed regions (and optional second exposed regions) and non-exposed regions, the first exposed regions comprising a pattern of corresponding electroless seed metal nuclei that have been electrolessly plated with the same or different metal in a crosslinked polymer derived from the reactive polymer in the reactive composition described herein, and the non-exposed regions comprising substantially no reactive composition.

Electroless Plating Method 5:

This method can be used to form a pattern in a polymeric layer, the method comprising:

providing a polymeric layer comprising a reactive composition that comprises: (1) a reactive polymer, and (2) optionally, a photo sensitizer, as described above, patternwise exposing the polymeric layer to radiation having a $\lambda_{max}$ of at least 150 nm that is sufficient to induce crosslinking within the reactive polymer, to provide a polymeric layer comprising non-exposed regions and exposed regions comprising an at least partially crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the at least partially crosslinked polymer in the exposed regions of the polymeric layer, removing the reactive composition comprising the reactive polymer in the non-exposed regions (at least 90 weight % of the original amount), contacting the exposed regions of the polymeric layer with electroless seed metal ions to form a pattern of electroless seed metal ions in the exposed regions of the polymeric layer, optionally contacting the pattern of electroless seed metal ions in the exposed regions of the polymeric layer with a non-reducing reagent that reacts with the electroless seed metal ions to form an electroless seed metal compound that has a $K_{sp}$ of less than 40, and electrolessly plating the electroless seed metal compound within the exposed regions of the polymeric layer with a metal that is the same as or different from the corresponding electroless seed metal compound.

Such method thus comprises providing a polymeric layer (as in forming the described precursor article), the polymeric layer comprising a reactive composition as described above comprising a reactive polymer and optionally, a photo sensitizer.

This polymeric layer in the precursor article, usually in dry form, can be then patternwise exposed as described above to radiation having a $\lambda_{max}$ of at least 150 nm and up to and including 450 nm or to radiation having a $\lambda_{max}$ of at least 150 nm and up to and including 400 nm, to provide a polymeric layer comprising non-exposed regions and exposed regions comprising a crosslinked polymer.

It is optional but desirable to heat or bake the polymeric layer in the precursor article simultaneously with or after the patternwise exposure but generally before contacting the exposed polymeric layer with electroless seed metal ions (described below) using conditions described above.

Generally, immediately after the patternwise exposing or optional heating procedures, the reactive composition remaining in the non-exposed regions of the polymeric layer is removed as described above for previous methods.

At this point, an intermediate article has been created in which the exposed regions of the polymeric layer on the substrate comprise crosslinked polymer derived from the reactive polymer in the reactive composition described above, and the non-exposed regions of the polymeric layer comprise substantially no reactive composition.

Then, the exposed regions of the polymeric layer are contacted with electroless seed metal ions to form coordinated electroless seed metal ions in the exposed regions of the polymeric layer using aqueous-based solutions and conditions as described above.

The contact with the electroless seed metal ions produces an intermediate article comprising a substrate and having disposed thereon a polymeric layer comprising exposed regions and non-exposed regions, the exposed regions comprising a pattern of electroless seed metal ions within the crosslinked polymer resulting from the irradiation of the reactive polymer in the reactive composition described herein, and the non-exposed regions comprise substantially no reactive composition.

After the requisite time to react the electroless seed metal ions within the crosslinked polymer in the exposed regions, the polymeric layer can be rinsed with distilled or deionized water or another aqueous-based solution for a suitable time and at a suitable temperature, for example usually room temperature or slightly higher.

The electroless seed metal ions in the exposed regions of the polymeric layer are then contacted with a non-reducing reagent that reacts with the electroless seed metal ions to form an electroless seed metal compound (containing the non-reducing reagent) deposited within the exposed regions of the polymeric layer containing the crosslinked polymer derived from the reactive polymer in the reactive composition described above.

Useful non-reducing reagents include any compound that will covalently, ionically, or otherwise bond to or react with the electroless seed metal ions to form the electroless seed metal compound. Useful non-reducing reagents include those that provide electroless seed metal compounds having a $pK_{sp}$ value of less than 40, and for example, a $pK_{sp}$ that is greater than 4 and less than 40. For example, such useful non-reducing reagents include but are not limited to, alkali metal and ammonium hydroxides, thiosulfates, thiocyanates, sulfites, small organic acids, and combinations thereof. Halides are also useful non-reducing reagents for this invention. Alkali metal hydroxides are particularly useful including mixtures thereof.

This contacting procedure can be carried out in various ways including immersing the intermediate article in an aqueous-based non-reducing solution comprising one or more non-reducing reagents at a concentration of at least 1 weight % based on total aqueous-based non-reducing solution weight. Alternatively, an aqueous-based non-reducing solution can be sprayed or coated onto the polymeric layer in the intermediate article. The time and temperature for this contacting would be readily apparent to one skilled in the art in order to best achieve the desired bonding. For example, the contacting can be carried out at room temperature (about 20° C.) and up to and including 95° C. and the time can be for at least 1 second and up to and including 30 minutes.

After this contact with the non-reducing reagent, the polymeric layer, especially the exposed regions, can be again washed using distilled water or deionized water or another aqueous-based solution under suitable conditions of time and temperature.

At this stage, another intermediate article has been created, which intermediate article comprises a substrate and having disposed thereon a polymeric layer comprising exposed regions and non-exposed regions, the exposed regions of the polymeric layer comprising a pattern of an electroless seed metal compound (comprising a non-reducing reagent as described above) and a crosslinked polymer derived from the reactive polymer in the reactive composition described above, wherein the electroless seed metal compound has a $pK_{sp}$ of less than 40, and the non-exposed regions comprise substantially no reactive composition.

This intermediate article can be immediately immersed in an aqueous-based electroless metal plating bath or solution, or the intermediate article can be stored with just the catalytic pattern comprising electroless seed metal compound for use at a later time.

The intermediate article can be contacted with an electroless plating metal that is the same as or different from the metal within the electroless seed metal compound using the aqueous-based solutions and conditions described above. In most embodiments, the electroless plating metal is a different metal from the metal within the electroless seed metal compound.

After the electroless plating procedure, the product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of an electroless seed metal compound (comprising a non-reducing reagent as described above) which has been electrolessly plated with the same or different metal that is part of the electroless seed metal compound within a crosslinked polymer derived from the reactive polymer in the reactive composition described above, and the non-exposed regions comprising substantially no reactive composition.

The present invention provides at least the following embodiments and combinations thereof, but other combinations of features are considered to be within the present invention as a skilled artisan would appreciate from the teaching of this disclosure:

1. A method for forming a pattern in a polymeric layer, the method comprising:

providing a polymeric layer comprising a reactive composition that comprises: (1) a reactive polymer that is metal ion-complexing, water-soluble, and crosslinkable, which reactive polymer comprises pendant photosensitive, aromatic or non-aromatic unsaturated heterocyclic groups each comprising a carbon-carbon double bond that is conjugated with an electron withdrawing group, and (2) optionally, a photosensitizer, patternwise exposing the polymeric layer to radiation having a $\lambda_{max}$ of at least 150 nm that is sufficient to provide at least partial crosslinking within the reactive polymer, to provide a polymeric layer comprising non-exposed regions and exposed regions comprising a crosslinked polymer derived from the reactive polymer, optionally heating the polymeric layer simultaneously with or after patternwise exposing the polymeric layer but before removing the reactive composition comprising the reactive polymer in the non-exposed regions, at a temperature sufficient to further crosslink the crosslinked polymer in the exposed regions of the polymeric layer, removing the reactive composition comprising the reactive polymer in the non-exposed regions, contacting the exposed regions of the polymeric layer with electroless seed metal ions to form a pattern of electroless seed metal ions in the exposed regions of the polymeric layer, reducing the pattern of electroless seed metal ions to provide a pattern of corresponding electroless seed metal nuclei in the exposed regions of the polymeric layer, and electrolessly plating the corresponding electroless seed metal nuclei in the exposed regions of the polymeric layer with a metal that is the same as or different from the corresponding electroless seed metal nuclei.

2. The method of embodiment 1, wherein the reactive polymer comprises pendant photosensitive, aromatic or non-aromatic unsaturated heterocyclic groups that comprise an α,β-unsaturated ketone, α,β-unsaturated lactone, α,β-unsaturated lactam, α,β-unsaturated ether, α,β-unsaturated thioether, or α,β-unsaturated amine.

3. The method of embodiment 1 or 2, wherein the reactive polymer comprises an aromatic or non-aromatic unsaturated heterocyclic group selected from the group consisting of coumarin, thiocoumarin, pyanone, pyran, thiopyran, thiopyranone, benzopyran, benzothiopyran, benzoquinone, naphthoquinone, quinoline, and quinolinone groups.

4. The method of any of embodiments 1 to 3, wherein the reactive polymer comprises pendant photosensitive coumarin or quinolinone groups.

5. The method of any of embodiments 1 to 4, wherein the polymeric layer further comprises a photosensitizes to provide sensitization at a $\lambda_{max}$ of least 150 nm and up to and including 750 nm.

6. The method of any of embodiments 1 to 5, wherein the reactive polymer comprises (a) recurring units comprising the pendant photosensitive, aromatic or non-aromatic unsaturated heterocyclic groups each comprising a carbon-carbon double bond that is conjugated with an electron withdrawing group, and (b) recurring units comprising pendant solubilizing groups, wherein the (a) recurring units are present in an amount of up to and including 50 mol %, and the (b) recurring units are present in an amount of at least 50 mol %, all based on the total recurring units in the reactive polymer.

7. The method of embodiment 6, wherein the reactive polymers comprises (a) recurring units in an amount of at least 2 mol % and up to and including 50 mol %, and (b) recurring units in an amount of at least 2 mol % and up to and including 98 mol %, based on the total reactive polymer recurring units.

8. The method of embodiment 6 or 7, wherein the (a) recurring units are represented by the following Structure (A):

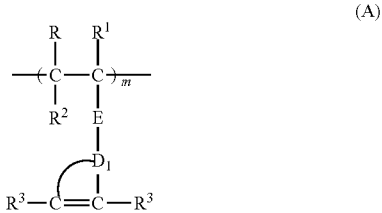

wherein R, $R^1$, and $R^2$ are independently hydrogen, an alkyl, cyano, or halo group, $R^3$ is hydrogen or an alkyl, aryl, alkoxy, aryloxy, halo, cyano, or carbonyl-containing group, $D_1$ represents the carbon and hetero atoms necessary to complete a three-membered to fourteen-membered non-aromatic heterocyclic ring including the shown carbon-carbon double bond, E is a single bond or divalent organic linking group connecting to any carbon atom of $D_1$, and m represents at least 2 mol % and up to and including 50 mol % of the total recurring units in the reactive polymer, provided that either $D_1$ or at least one of the $R^3$ groups comprises at least one electron withdrawing group that is conjugated with the shown carbon-carbon double bond.

9. The method of any of embodiments 6 to 8, wherein the (b) recurring units comprise pendant carboxylic acid, carboxylate, sulfonic acid, or sulfonate groups.

10. The method of any of embodiments 6 to 9, wherein the reactive polymer further comprises one or more additional (c) recurring units that are different from all (a) and (b) recurring units, the one or more additional (c) recurring units being present in an amount of up to and including 20 mol % based on the total reactive polymer recurring units.

11. The method of any of embodiments 1 to 10, further comprising:
heating the polymeric layer after patternwise exposing the polymeric layer but before removing the reactive composition comprising the reactive polymer in the non-exposed regions, at a temperature sufficient to further crosslink the reactive polymer in the exposed regions of the polymeric layer.

12. The method of any of embodiments 1 to 11, comprising contacting the exposed regions in the polymeric layer with electroless seed metal ions selected from the groups consisting of silver ions, platinum ions, palladium ions, gold ions, rhodium ions, nickel ions, iridium ions, tin ions, and copper ions.

13. The method of any of embodiments 1 to 12, comprising electrolessly plating with a metal that is selected from the group consisting of copper(II), silver(I), gold(IV), palladium(II), platinum(II), nickel(II), chromium(II), and combinations thereof.

14. The method of any of embodiments 1 to 13, comprising patternwise exposing the polymeric layer to radiation having a $\lambda_{max}$ of at least 150 nm and up to and including 450 nm.

15. The method of any of embodiments 1 to 14, comprising reducing the electroless seed metal ions in the exposed regions of the polymeric layer with a reducing agent that is a borane, aldehyde, hydroquinone, or sugar reducing agent.

16. A precursor article used in any of embodiments 1 to 15 comprising a substrate and having disposed thereon a polymeric layer comprising a reactive composition that comprises: (1) a reactive polymer that is metal ion-complexing, water-soluble, and crosslinkable, which reactive polymer comprises pendant photosensitive, aromatic or non-aromatic unsaturated heterocyclic groups each comprising a carbon-carbon double bond that is conjugated with an electron withdrawing group, and (2) optionally, a photosensitizer.

17. An intermediate article obtained using any of embodiments 1 to 15, the intermediate article comprising a substrate and having disposed thereon a polymeric layer comprising exposed regions and non-exposed regions,
the exposed regions comprising a pattern of at least partially crosslinked polymer that has been derived from a reactive polymer that is metal ion-complexing, water-soluble, and crosslinkable, which reactive polymer comprises pendant photosensitive, aromatic or non-aromatic unsaturated heterocyclic groups each comprising a carbon-carbon double bond that is conjugated with an electron withdrawing group, and
the non-exposed regions comprising a reactive composition that comprises: (1) the reactive polymer, and (2) optionally, a photosensitizer.

18. An intermediate article obtained using any of embodiments 1 to 15, the intermediate article comprising a substrate and having disposed thereon a polymeric layer comprising exposed regions and non-exposed regions,
the exposed regions comprising a pattern of at least partially crosslinked polymer that has been derived from a reactive polymer that is metal ion-complexing, water-soluble, and crosslinkable, which reactive polymer comprises pendant photosensitive, aromatic or non-aromatic unsaturated heterocyclic groups each comprising a carbon-carbon double bond that is conjugated with an electron withdrawing group, and the non-exposed regions comprising none of the reactive polymer.

19. An intermediate article obtained using any of embodiments 1 to 15, the intermediate article comprising a substrate and having disposed thereon a polymeric layer comprising exposed regions and non-exposed regions, the exposed regions comprising a pattern of electroless seed metal ions complexed within an at least partially crosslinked polymer that has been derived from a reactive polymer that is metal ion-complexing, water-soluble, and crosslinkable, which reactive polymer comprises pendant photosensitive, aromatic or non-aromatic unsaturated heterocyclic groups each comprising a carbon-carbon double bond that is conjugated with an electron withdrawing group, and the non-exposed regions comprising none of the electroless seed metal ions or the reactive polymer.

20. An intermediate article obtained using any embodiments 1 to 14, the intermediate article comprising a substrate and having disposed thereon a polymeric layer comprising exposed regions and non-exposed regions, the exposed regions comprising a pattern of electroless seed metal nuclei complexed within an at least partially crosslinked polymer that has been derived from a reactive polymer that is metal ion-complexing, water-soluble, and crosslinkable, which reactive polymer comprises pendant photosensitive, aromatic or non-aromatic unsaturated heterocyclic groups each comprising a carbon-carbon double bond that is conjugated with an electron withdrawing group, and the non-exposed regions comprising none of the electroless seed metal nuclei or the reactive polymer that is metal ion-complexing, water-soluble, and crosslinkable.

21. A product article obtained from any of embodiments 1 to 15, the product article comprising a substrate and having disposed thereon a polymeric layer comprising exposed regions and non-exposed regions, the exposed regions comprising a pattern of electrolessly plated metal complexed within or deposited on the surface of an at least partially crosslinked polymer that has been derived from a reactive polymer that has been derived from a reactive polymer that is metal ion-complexing, water-soluble, and crosslinkable, which reactive polymer comprises pendant photosensitive, aromatic or non-aromatic unsaturated heterocyclic groups each comprising a carbon-carbon double bond that is conjugated with an electron withdrawing group, and the non-exposed regions comprising none of the electrolessly plated metal or the reactive polymer.

The following Examples are provided to illustrate the practice of this invention and are not meant to be limiting in any manner.

Synthesis of
7-(2-Methacryloyloxyethoxy)-4-methylcoumarin:

4-Methylumbelliferone (7-hydroxy-4-methylcourmarin) (5.44 g, 30.9 mmol) was suspended in 150 ml of tetrahydrofuran (THF) and 4.42 g (34.0 mmol) of 2-hydroxyethyl methacrylate were added, followed by 8.42 g (32.1 mmol) of triphenylphosphine. The solids slowly dissolved with stirring at room temperature under nitrogen. Then, 6.37 g (31.5 mmol) of diisopropyl azodicarboxylate were added dropwise while the temperature was kept below 25° C. The reaction solution was stirred overnight at room temperature.

Most of the solvent was evaporated and then ether was added to precipitate a white solid that was put into a freezer for a few hours. The solid was collected by filtration and rinsed with ether, and dried on the filter to obtain 12.14 g of a white solid that was purified by chromatography (silica gel: 50/50 ethyl acetate/methylene chloride). This procedure provided a white solid that was slurried with heptane and filtered and dried to provide a total of 6.77 g (76% yield) of the desired monomer.

Alternative Synthesis of
7-(2-methacryloyloxyethoxy)-4-methylcoumarin
Monomer

4-Methylumbelliferone (7-hydroxy-4-methylcourmarin) (15.3 g, 0.087 mol) was dissolved in about 300 ml of N,N-dimethylacetamide (DMA) in a 3-neck, 1-liter flask with an overhead stirrer. Then, 48 g (0.347 mol) of potassium carbonate, 20.8 g (0.1 mol) of 2-((methylsulfonyl)oxy) ethyl methacrylate prepared from 2-hydroxyethyl methacrylate using standard procedures, and 1.66 g (0.10 mol) of potassium iodide were then added and the mixture was heated in an oil bath at 70° C. for about 18 hours. Thin layer chromatography indicated that the reaction was complete. The reaction solution was cooled and poured into about 1 liter of water, stirred for about an hour, and the resulting precipitate collected by filtration. The precipitate was rinsed with another 1 liter of water, rinsed with heptane, and then dried. The desired product was confirmed by NMR. A portion of the product was further purified by silica gel chromatography with ethyl acetate. The ethyl acetate was removed by evaporation and the product was crystallized from heptane to obtain a white powder.

Preparation of Polymer A from Methacrylic Acid
and
7-(2-Methacryloyloxyethoxy)-4-methylcoumarin Methacrylic acid (3.5 g, 40,7 mmol) and 2.93 g (10.2 mmol) of 7-(2-methacryloyloxyethoxy)-4-methylcoumarin were added to a 100 ml single-neck round bottom flask dissolved with heating in about 35 g of tetrahydrofuran (THF) and Dowanol® PM to provide 16% solids. After purging with nitrogen, 0.03 g (0.5 weight % of the weight of the combined monomers) of 2,2'azodi(2-methylbutyronitrile) (AMBN) initiator was added and placed in a preheated oil bath at 65° C. The solids dissolved after about 5 minutes and the reaction mixture was stirred overnight.

The resulting Polymer A was precipitated in acetone and filtered, and dried in a high vacuum oven at room temperature for a few hours. An evaluation by NMR was made to confirm the formation of the desired polymer. Polymer A was obtained as 6.40 g of a white solid. The Polymer A weight average molecular weight ($M_W$) was 184,000 as determined by size exclusion chromatography (SEC). A 15 weight % solids aqueous solution was prepared and neutralized at 75 mol % using sodium hydroxide.

Preparation of Polymer B from Methacrylic Acid
and
7-(2-Methacryloyloxyethoxy)-4-methylcoumarin
Using Polar Solvents Methacrylic acid (2.5 g, 29.0 mmol) and 2.09 g (72.6 mmol) of 7-(2-methacryloyloxyethoxy)-4-methylcoumarin were weighed out into a 100 ml single neck round bottomed flask and suspended in 18.36 g (20% solids) of a 50/50 weight mixture of methyl ethyl ketone (MEK)/isopropanol (IPA). AMBN initiator was added (0.02 g, 0.5 weight % of the weight of the combined monomers) and the reaction mixture was purged with nitrogen for 30 minutes as a suspension (without stirring). The vessel was capped with a septum and set in a preheated oil bath at 70° C. overnight. The coumarin-containing monomer dissolved in about 5 minutes with heat. The reaction solution stayed clear for about 1.5 hours and then a precipitate was formed. Reaction was allowed to continue for about 18 hours. The reaction mixture was cooled and the contents of the flask (white solid and clear liquid) were added to about 500 ml of acetone with over head stirring. The white solid was collected by filtration, any large chunks were crushed with a mortar and pestle, and then added to another 500 ml of fresh acetone and stirred using an over head stirrer for about 2.5 hours. The solid was filtered and dried to provide 4.0 g (87%) of desired Polymer B the structure of which was verified structure by NMR. The Polymer B weight average molecular weight ($M_W$) was 342,000 as determined by size exclusion chromatography (SEC). A 5 weight % solids aqueous solution was prepared and neutralized at 75 mol % using sodium hydroxide.

Preparation of Polymer C from Methacrylic acid and 7-(2-Methacryloyloxyethoxy)-4-methylcoumarin Using Aqueous Solvents Methacrylic acid (5.45 g, 63.6 mmol) and 4.56 g (15.8 mmol) of 7-(2-methacryloyloxyethoxy)-4-methylcoumarin monomers were weighed out in a 250 ml round bottom flask with 52 g of a 50/50% weight ratio of water/IPA to 19% solids and nitrogen purged with slow stirring. 4,4-Azobis cyanovaleric acid initiator (0.1 g, 1 weight % of the weight of the combined monomers) was added and the flask was placed in a preheated oil bath at 75° C. with a condenser and under nitrogen. After about fifteen minutes, it appeared that some of the coumarin-containing monomer had dissolved. The reaction was run for about 18 hours, and the reaction solution was cooled to 45° C. and 75% of the methacrylic acid was neutralized using 5 weight % sodium hydroxide solution. The IPA was evaporated, the polymer solution extracted with MEK, and then water was added to obtain a 6.81% solids solution. The desired Polymer C structure was verified by NMR and had a weight average molecular weight ($M_W$) of 252,000 as determined by size exclusion chromatography (SEC).

Preparation of Polymer D from Methacrylic Acid and 7-(2-methacryloyloxyethoxy)-4-methylcoumarin Using Polar Aprotic Solvent Methacrylic acid (4.04 g, 46.9 mmol), 3.38 g (11.7 mmol) of 7-(2-methacryloyloxyethoxy)-4-methylcoumarin, and 0.04 g (0.5 weight % of the weight of the combined monomers) of AMBN initiator were weighed out into a 100 ml single neck round bottom flask, suspended in 29.68 g of N-N-dimethyl acetamide (DMA) (20% solids), and purged with nitrogen for 30 minutes. The flask was capped with a septum and set into a preheated oil bath at 65° C. overnight with magnetic stirring. After about 18 hours, the reaction mixture was observed to be clear, colorless, and viscous. The reaction mixture was cooled and the contents of the flask were added to about 500 ml of acetone with over head stirring. Solids were collected by filtration and any large chunks were crushed using a mortar and pestle and then redissolved in DMA at about 25 weight % solids. The solution was precipitated in about 1.6 liter of water and the precipitate was filtered and dried in a vacuum oven to provide 6.10 g (82%) of a white solid Polymer D whose structure was verified by NMR. The weight average molecular weight ($M_W$) was 318,000 as determined by size exclusion chromatography (SEC). An 11 weight % solids aqueous solution was neutralized at 75 mol % using sodium hydroxide.

Preparation of Polymer E from Sulfopropyl Methacrylate Potassium Salt and 7-(2-Methacryloyloxyethoxy)-4-methylcoumarin using Polar Aprotic Solvent and Water Five grams (20.3 mmol) of sulfopropyl methacrylate potassium salt and 1.46 g (5.1 mmol) of 7-(2-methacryloyloxyethoxy)-4-methylcoumarin were weighed into a 100 ml single-neck round bottom and suspended in about 13 g of DMA and 20 g of water. Then, 0.065 g (1.0 weight % of the weight of the combined monomers) of Vazo 68 polymerization initiator were added and the reaction vessel was capped with a septum, purged with nitrogen for about 30 minutes, and placed in a preheated continuous temperature bath at 73° C. overnight. The solids began to dissolve but the solution remained hazy.

The reaction mixture was cooled to room temperature and transferred to a separatory funnel containing more water. The reaction mixture was then extracted twice with ethyl acetate and dialyzed overnight. The diluted reaction solution was concentrated by evaporation to a concentration of 8.12 weight % solids. The resulting Polymer E was determined to have a weight average molecular weight ($M_W$) of 548,000 as determined by size exclusion chromatography (SEC).

Preparation of the Electroless Copper Plating Bath

The following components were dissolved in a glass container that had been cleaned with concentrated nitric acid followed by a thorough rinse with distilled water to eliminate any trace of metal on the glass. 1.8 g of copper (II) sulfate pentahydrate, 6.25 g of tetrasodium EDTA(ethylenediaminetetraacetic acid) tetrahydrate, 0.005 g of potassium ferrocyanide trihydrate, 2.25 g of 37 weight % formaldehyde solution, 80 g of distilled water, and 2 to 3 g of 45 weight % sodium hydroxide solution to adjust the pH to 12.8.

Preparation of the Electroless Nickel Plating Bath

The following components were dissolved in a glass container that was pre-cleaned with concentrated nitric acid followed by a thorough rinse with distilled water to eliminate any trace of metal on the glass. 0.36 g of nickel (II) sulfate hexahydrate, 3.37 g of 85% lactic acid solution, 1.42 g of glacial acetic acid, 0.26 g of propionic acid, 0.25 ppm of thiourea, 100 ppm of methanol solution, 2.835 g of 14 molar ammonium hydroxide, 78.24 g of distilled water, and about 1.8 g of sodium hypophosphite partial hydrate (assume 95% anhydrous) added immediately before use.

Preparation of Polymer Films and Conductive Metal Patterns

INVENTION EXAMPLE 1

Exposure and Conductive Pattern Formation Without a Photosensitizer

An aqueous reactive composition containing 10 weight % of reactive Polymer A obtained as described above with 0.05 weight % of the surfactant Dupont Capstone FS-35 was filtered with a 1 μm syringe filter and spin coated at 2000 RPM to provide a polymeric layer onto PET [poly(ethylene terephthalate)] film to which an adhesion layer of a copolymer derived from glycidyl methacrylate and butyl acrylate had been applied before stretching to provide precursor articles.

Five of these precursor articles were imagewise exposed to ultraviolet light (350 nm to 450 nm) through a chrome-on-quartz contact mask for 1, 2, 4, 8, or 15 seconds, respectively, to provide exposed regions and non-exposed regions in the polymeric layer, and then cured using a vacuum hotplate at 60° C. for 60 seconds.

Following the hotplate curing, the exposed and heated precursor articles were then immersed in well agitated distilled water for 2 minutes to wash off the reactive composition from the non-exposed regions of the polymeric layer. All washed intermediate precursors were then immersed in a 0.4 molar silver nitrate aqueous-based solution for 1 minute, rinsed in distilled water, immersed in a 1 weight % dimethylamine borane (DMAB) aqueous-based solution for 30 seconds, and another distilled water rinse. The resulting intermediate articles were then immersed in the aqueous-based electroless copper plating bath described above for 6 minutes. A brilliant continuous copper film was formed in all exposed regions at all exposure times of the product articles. Fine highly conductive copper lines of about 10 μm or less were reproduced and showed high conductivity at all exposures except at 1 second where the copper plating was very slow.

INVENTION EXAMPLE 2

Exposure and Conductive Pattern Formulation Using a Photosensitizer

An aqueous reactive composition containing 5 weight % of reactive Polymer D, 0.01 weight % of 2H-1-benzopyran-2-one, 3,3'-carbonylbis(5,7-diethoxy)-(added as a 0.05 weight % solution in cyclopentanone), and 0.05 weight % of the surfactant Dupont Capstone FS-35 was prepared as a cloudy solution containing a fine dispersion of the photosensitizer that readily passed through a 1 μm pore size filter.

The reactive composition was spin coated at 2000 RPM to provide a polymeric layer onto a PET (polyethylene terephthalate) film that had a polymeric adhesion layer comprising a copolymer derived from glycidyl methacrylate and n-butyl acrylate applied before stretching as previously described and held at room temperature for 60 minutes, to provide precursor articles (no additional baking was carried out).

Four of these precursor articles were exposed to 350 nm to 450 nm ultraviolet light through a chrome-on-quartz contact mask for a time series of 1, 2, 4, or 8 seconds, respectively, to provide exposed and non-exposed regions in the polymeric layer, held at room temperature for 30 to 60 minutes, and then heated to 60° C. for 60 seconds. The imagewise exposed and heated precursor articles were then immersed in well agitated distilled water for 2 minutes to wash off the reactive composition in the non-exposed regions of the polymeric layer. The resulting intermediate articles were then immersed in a 0.4 molar silver nitrate aqueous-based solution for 1 minute, rinsed in distilled water, immersed in a 1 weight % dimethylamine borane (DMAB) aqueous-based solution for 30 seconds, followed by a distilled water rinse. These intermediate articles were then immersed in the aqueous-based electroless copper bath as described above for 6 minutes. Fine highly conductive copper lines of about 10 μm or less were observed in the product articles that had been imagewise exposed for 2 seconds or more.

Precursor articles similarly prepared using reactive Polymer D but without the photosensitizer in the reactive composition required imagewise exposure at 8 seconds to produce highly conductive copper lines using a similar process.

INVENTION EXAMPLE 3

Conductive Pattern Formation Using Nickel Plating and a Palladium Catalyst

An aqueous reactive composition containing 5 weight % of Reactive Polymer B obtained as described above with 0.05 weight % of the surfactant Dupont Capstone FS-35 was filtered with a 1 μm syringe filter and spin coated at 2000 RPM to provide a polymeric layer onto PET [poly(ethylene terephthalate)] film to which an adhesion layer of a copolymer derived from glycidyl methacrylate and butyl acrylate had been applied before stretching to provide precursor articles.

Three precursor articles were baked for 45 minutes at 60° C. before imagewise exposure to ultraviolet light through a chrome-on-quartz contact mask for 15 seconds, to provide exposed regions and non-exposed regions in the polymeric layer. The precursor articles were held at room temperature for 30 to 60 minutes and then baked on a vacuum hotplate at 60° C. for 60 seconds.

Following the room temperature and the hotplate curing, the exposed precursor articles were then immersed in well agitated distilled water for 2 minutes to wash off the reactive composition from the non-exposed regions of the polymeric layer. All washed intermediate precursors were then immersed in a 0.001 molar aqueous-based solution of palladium chloride dissolved in 50:50 water and acetonitrile mixture for 10 minutes, rinsed in distilled water, immersed in a 1 weight % dimethylamine borane (DMAB) aqueous-based solution for 5 minutes, and rinsed again washed using distilled water. The resulting intermediate articles were then immersed in the aqueous-based electroless nickel plating bath described above for 10 minutes at 55° C. A brilliant continuous nickel film was formed in all exposed regions in the product articles. Fine nickel lines of about 10 μm or less were reproduced and showed desired conductivity.

INVENTION EXAMPLE 4

Preparation of Polymer Films and Photo-Patterned Copper Using a Reactive Polymer Having Sulfonate Functionality An aqueous solution of 7.5 weight % of Polymer E obtained from the 8.12 weight % preparation described above with 0.05 weight % of the surfactant Dupont Capstone FS-35 to form a reactive composition that was filtered with a 1 μm syringe filter and spin coated at 2000 RPM onto PET(polyethylene terephthalate) film substrate having a polymeric adhesion layer of a polymer derived from glycidyl methacrylate and butyl acrylate that had been applied before stretching as previously described, to form a polymeric layer. The resulting precursor article was held at room temperature for 60 minutes.

The precursor article was exposed to 350 nm to 450 nm ultraviolet radiation through a chrome-on-quartz contact mask for a time of 2 seconds, held at room temperature for 45 minutes, and then heated to 60° C. for 60 seconds on a vacuum hotplate. The exposed and heated intermediate article was then immersed in well agitated distilled water for 2 minutes to wash off the reactive polymer in the non-exposed regions from the substrate. The washed intermediate article was then immersed in a 0.4 molar silver nitrate solution for 1 minute, rinsed in distilled water, immersed in a 1 weight % dimethylamine borane (DMAB) bath for 30 seconds, and washed again with distilled water.

The resulting intermediate article was then immersed in the electroless copper plating bath described above for 6 minutes. A brilliant continuous copper film was formed in all exposed regions of the polymeric layer. Fine highly conductive copper lines of about 10 μm or less were produced, demonstrating that Polymer E with sulfonate functionality was photopatterned and complexed reactive metal ions that catalyzed electroless metal plating.

The invention has been described in detail with particular reference to certain particularly useful embodiments thereof, but it will be understood that variations and modifications can be effected within the spirit and scope of the invention.

The invention claimed is:

1. A method for forming a pattern in a polymeric layer, the method comprising:
providing a polymeric layer comprising a reactive composition that comprises: (1) a reactive polymer that is metal ion-complexing, water-soluble, and crosslinkable, which reactive polymer comprises pendant photosensitive, aromatic or non-aromatic heterocyclic groups each comprising a carbon-carbon double bond that is conjugated with an electron withdrawing group, and (2) optionally, a photosensitizer,
patternwise exposing the polymeric layer to radiation having a $\lambda_{max}$ of at least 150 nm that is sufficient to provide at least partial crosslinking within the reactive polymer, to provide a polymeric layer comprising non-exposed regions and exposed regions comprising a crosslinked polymer derived from the reactive polymer,
optionally heating the polymeric layer simultaneously with or after patternwise exposing the polymeric layer but before removing the reactive composition comprising the reactive polymer in the non-exposed regions, at a temperature sufficient to further crosslink the crosslinked polymer in the exposed regions of the polymeric layer,
removing the reactive composition comprising the reactive polymer in the non-exposed regions,
contacting the exposed regions of the polymeric layer with electroless seed metal ions to form a pattern of electroless seed metal ions in the exposed regions of the polymeric layer,
reducing the pattern of electroless seed metal ions to provide a pattern of corresponding electroless seed metal nuclei in the exposed regions of the polymeric layer, and
electrolessly plating the corresponding electroless seed metal nuclei in the exposed regions of the polymeric layer with a metal that is the same as or different from the corresponding electroless seed metal nuclei.

2. The method of claim 1, wherein the reactive polymer comprises pendant photosensitive, aromatic or non-aromatic heterocyclic groups that comprise an α,β-unsaturated ketone, α,β-unsaturated lactone, α,β-unsaturated lactam, α,β-unsaturated ether, α,β-unsaturated thioether, or α,β-unsaturated amine.

3. The method of claim 1, wherein the reactive polymer comprises pendant photosensitive, aromatic or non-aromatic heterocyclic groups selected from the group consisting of coumarin, thiocoumarin, pyranone, pyran, thiopyran, thiopyranone, benzopyran, benzothiopyan, benzoquinone, naphthoquinone, quinoline, and quinolinone groups.

4. The method of claim 1, wherein the reactive polymer comprises pendant photosensitive coumarin or quinolinone groups.

5. The method of claim 1, wherein the reactive polymer comprises pendant photosensitive coumarin groups.

6. The method of claim 1, wherein the polymeric layer further comprises a photosensitizer to provide sensitization at a $\lambda_{max}$ of least 150 nm and up to and including 750 nm.

7. The method of claim 1, wherein the reactive polymer comprises (a) recurring units comprising the pendant photosensitive, aromatic or non-aromatic unsaturated heterocyclic groups each comprising a carbon-carbon double bond that is conjugated with an electron withdrawing group, and (b) recurring units comprising pendant solubilizing groups, wherein the (a) recurring units are present in an amount of up to and including 50 mol %, and the (b) recurring units are present in an amount of at least 50 mol %, all based on the total recurring units in the reactive polymer.

8. The method of claim 7, wherein the reactive polymers comprises (a) recurring units in an amount of at least 2 mol % and up to and including 98 mol %, based on the total reactive polymer recurring units.

9. The method of claim 7, wherein the (a) recurring units are represented by the following Structure (A):

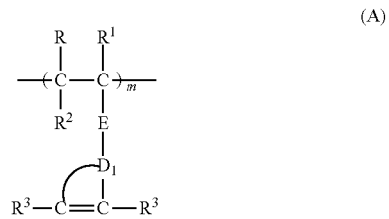

wherein R, $R^1$, and $R^2$ are independently hydrogen, an alkyl, cyano, or halo group, $R^3$ is hydrogen or an alkyl, aryl, alkoxy, aryloxy, halo, cyano, or carbonyl-containing group, $D_1$ represents the carbon and hetero atoms necessary to complete a three-membered to fourteen-membered aromatic or non-aromatic heterocyclic ring including the shown carbon-carbon double bond, E is a single bond or divalent organic linking group connecting to any carbon atom of $D_1$, and m represents at least 2 mol % and up to and including 50 mol % of the total recurring units in the reactive polymer,
provided that either $D_1$ or at least one of the $R^3$ groups comprises at least one electron withdrawing group that is conjugated with the shown carbon-carbon double bond.

10. The method of claim 7, wherein the (b) recurring units comprise pendant carboxylic acid, carboxylate, sulfonic acid, or sulfonate groups.

11. The method of claim 7, wherein the reactive polymer further comprises one or more additional (c) recurring units that are different from all (a) and (b) recurring units, the one or more additional (c) recurring units being present in an amount of up to and including 20 mol % based on the total reactive polymer recurring units.

12. The method of claim 1, further comprising:
heating the polymeric layer after patternwise exposing the polymeric layer but before removing the reactive composition comprising the reactive polymer in the non-exposed regions, at a temperature sufficient to further crosslink the reactive polymer in the exposed regions of the polymeric layer.

13. The method of claim 1, comprising contacting the exposed regions in the polymeric layer with electroless seed metal ions selected from the group consisting of silver ions, platinum ions, palladium ions, gold ions, rhodium ions, nickel ions, iridium ions, tin ions, and copper ions.

14. The method of claim 1, comprising electrolessly plating with a metal that is selected from the group consisting of copper(II), silver(I), gold(IV), palladium(II), platinum (II), nickel(II), chromium(II), and combinations thereof.

15. The method of claim 1, comprising patternwise exposing the polymeric layer to radiation having a $\lambda_{max}$ of at least 150 nm and up to and including 450 nm.

16. The method of claim 1, comprising reducing the electroless seed metal ions in the exposed regions of the polymeric layer with a reducing agent that is a borane, aldehyde, hydroquinone, or sugar reducing agent.

17. A precursor article comprising a substrate and having disposed thereon a polymeric layer comprising a reactive composition that comprises: (1) a reactive polymer that is metal ion-complexing, water-soluble, and crosslinkable, which reactive polymer comprises (a) recurring units comprising pendant photosensitive, aromatic or non-aromatic heterocyclic groups each comprising a carbon-carbon double bond that is conjugated with an electron withdrawing group, and (b) recurring units comprising pendant carboxylic acid, carboxylate, sulfonic acid, or sulfonate groups, and (2) optionally, a photosensitizer, wherein the (a) recurring units are present in an amount of up to and including 50 mol % and the (b) recurring units are present in an amount of at least 50 mol %, all based on the total recurring units in the reactive polymer, and the pendant photosensitive, aromatic or non-aromatic heterocyclic groups are pendant photosensitive coumarin, thiocoumarin, quinone, benzoquinone, naphthoquinone, pyridinone, or quinolinone groups.

18. The precursor article of claim 17 wherein the (a) recurring units are derived from one or more of:
7-(2-methacryloyloxyethoxy)-4-methylcoumarin,
7-(2-methacryloyloxyethoxy)-coumarin,
7-(3-methacryloyloxysulfopropyl)-4-methylcoumarin,
7-(methacryloyloxy)-4-methylcoumarin,
6-(methacryloyloxy)-4-methylcoumarin,
6-(2-methacryloyloxyethoxy)-4-methylcoumarin,
7-(2-methacryloyloxyethoxy)-quinoline-2-one,
7-(2-methacryloyloxyethoxy)-4-methylquinoline-2-one, and
5-(2-methacryloyloxyethoxy)-naphthoquinone.

19. The precursor article of claim 17 wherein the reactive polymer is one of the following copolymers:
poly(7-(2-methacryloyloxyethoxy)-4-methylcoumarin-co-methacrylic acid) (20:80 mol ratio);
poly(7-(2-methacryloyloxyethoxy)-4-methylcoumarin-co-acrylic acid) (30:70 mol ratio);
poly(7-(2-methacryloyloxyethoxy)-4-methylcoumarin-co-methacrylic acid-co-butyl acrylate) (20:70:10 mol ratio);
poly(7-(2-methacryloyloxyethoxy)-4-methylcoumarin-co-3-sulfopmpylmethacrylate potassium salt) (20:80 mol ratio);
poly(7-(2-methacryloyloxyethoxy)-4-methylcoumarin-co-methacrylic acid-co-glycidyl methacrylate) (20:75:5 mol ratio);
poly(7-(2-methacryloyloxyethoxy)-4-methylcoumarin-co-3-sulfopropylmethacrylate potassium salt) (50:50 mol ratio);
poly(7-(2-methacryloyloxyethoxy)-4-methylcoumarin-co-3-sulfopropylmethacrylate potassium salt-co-methacrylic acid) (20:40:40 mol ratio);
poly(6-(2-methacryloyloxyethoxy)-4-methylcoumarin-co-methacrylic acid) (20:80 mol ratio);
poly(6-(2-methacryloyloxyethoxy)-coumarin-co-methacrylic acid) (20:80 mol ratio); or
poly(6-(2-methacryloyloxyethoxy)-4-methylquinoline-2-one-co-methacrylic acid) (20:80 mol ratio).

20. A product article comprising a substrate and having disposed thereon a polymeric layer comprising exposed regions and non-exposed regions,
the exposed regions comprising a pattern of electrolessly plated metal complexed within or deposited on the surface of an at least partially crosslinked polymer that has been derived from a reactive polymer that is metal ion-complexing, water-soluble, and crosslinkable, which reactive polymer comprises pendant photosensitive, aromatic or non-aromatic heterocyclic groups each comprising a carbon-carbon double bond that is conjugated with an electron withdrawing group, and
the non-exposed regions comprising none of the electrolessly plated metal or the reactive polymer.

* * * * *